United States Patent
Zimmerman et al.

(10) Patent No.: US 7,592,637 B2
(45) Date of Patent: Sep. 22, 2009

(54) LIGHT EMITTING DIODES WITH REFLECTIVE ELECTRODE AND SIDE ELECTRODE

(75) Inventors: Scott M. Zimmerman, Baskin Ridge, NJ (US); Karl W. Beeson, Princeton, NJ (US)

(73) Assignee: Goldeneye, Inc., San Diego, CA (US)

( * ) Notice: Subject to any disclaimer, the term of this patent is extended or adjusted under 35 U.S.C. 154(b) by 560 days.

(21) Appl. No.: 11/454,816

(22) Filed: Jun. 16, 2006

(65) Prior Publication Data
US 2006/0284190 A1   Dec. 21, 2006

Related U.S. Application Data

(60) Provisional application No. 60/691,504, filed on Jun. 16, 2005.

(51) Int. Cl.
H01L 29/22 (2006.01)
H01L 29/24 (2006.01)
(52) U.S. Cl. .............................. 257/98; 257/99; 257/103
(58) Field of Classification Search .................... 257/79, 257/86, 91, 94, 98, 99, 102, 103, E33.062, 257/E33.063, E33.064, E33.065, E33.068, 257/E31.099, E31.105, E51.018, E51.019
See application file for complete search history.

(56) References Cited

U.S. PATENT DOCUMENTS

| | | | | |
|---|---|---|---|---|
| 4,268,842 A | * | 5/1981 | Jacob et al. | 257/76 |
| 4,408,217 A | * | 10/1983 | Kobayashi et al. | 257/76 |
| 4,608,581 A | * | 8/1986 | Bagratishvili et al. | 257/76 |
| 6,023,076 A | * | 2/2000 | Shibata | 257/94 |
| 6,071,795 A | | 6/2000 | Cheung et al. | |
| 6,746,889 B1 | | 6/2004 | Eliashevich et al. | |
| 6,831,302 B2 | | 12/2004 | Erchak et al. | |

* cited by examiner

*Primary Examiner*—Hung Vu
(74) *Attorney, Agent, or Firm*—William Propp

(57) ABSTRACT

A light emitting diode includes a first doped semiconductor layer, an active region and a second doped semiconductor layer. The first reflective electrode of the light emitting diode is connected to the edge surfaces of the first doped semiconductor layer. The second reflective electrode includes an optically transparent layer and is connected to the second doped semiconductor layer. The second reflective electrode may include a plurality of electrically conductive contacts extending from a reflective conductive metallic layer through a transparent layer. A method is described for fabricating the light emitting diode.

26 Claims, 24 Drawing Sheets

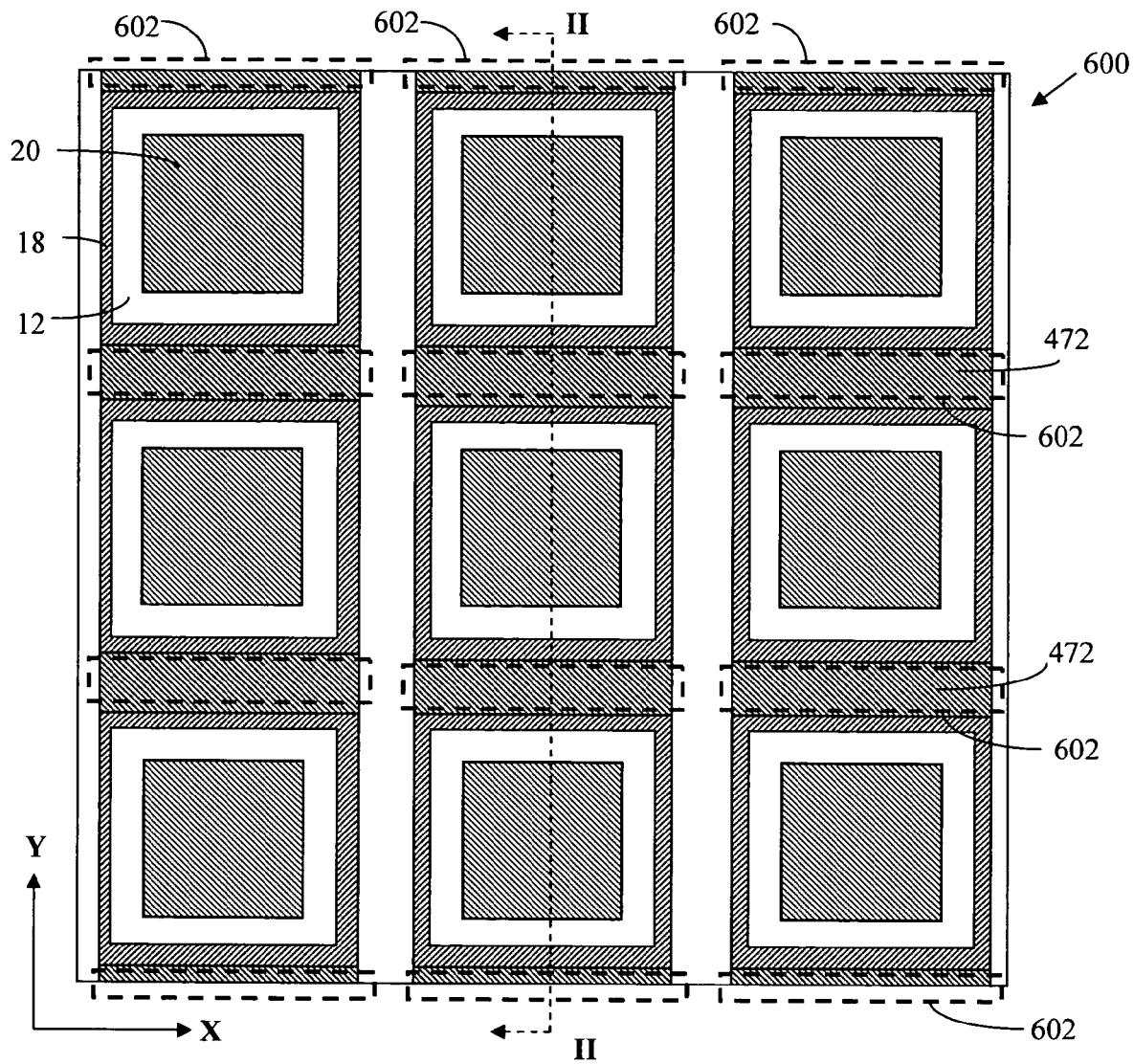
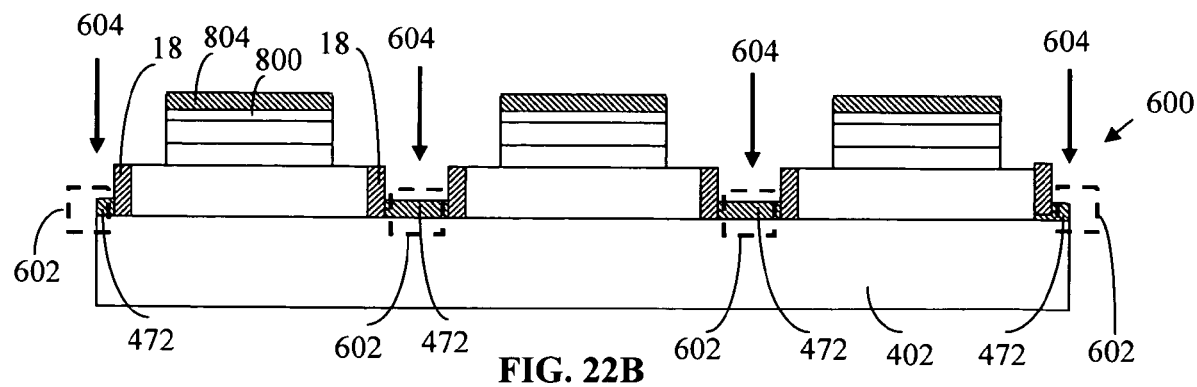
FIG. 22A
FIG. 22B

LIGHT EMITTING DIODES WITH REFLECTIVE ELECTRODE AND SIDE ELECTRODE

This application claims the benefit under 35 USC §119(e) of U.S. Provisional Application No. 60/691,504, filed Jun. 16, 2005, the contents of which is hereby incorporated by reference in its entirety.

FIELD OF THE INVENTION

The present invention relates to light emitting diodes and to methods for fabricating light emitting diodes.

BACKGROUND OF THE INVENTION

Light emitting diodes can be fabricated by depositing one or more layers of a semiconductor material onto a growth substrate. Deposition methods can include chemical vapor deposition (CVD), metal-organic chemical vapor deposition (MOCVD), molecular beam epitaxy MBE), liquid phase epitaxy (LPE) and vapor phase epitaxy (VPE). When a layer of semiconductor material is deposited onto a growth substrate, tensile or compressive stresses can occur that affect the planarity of the deposited film and the growth substrate as well as the electrical and optical properties of the semiconductor layer.

In one example, gallium nitride based light emitting diode (LED) devices can be formed by depositing one or more thin layers of the semiconductors gallium nitride (GaN), aluminum gallium nitride (AlGaN), indium gallium nitride (InGaN) or aluminum indium gallium nitride (AlInGaN) onto non-native growth substrates such as sapphire or silicon carbide (SiC). Due to thermal expansion effects at high deposition temperatures and lattice mismatches between the semiconducting layer and the growth substrate, a significant number of defects are introduced into the semiconducting layers during deposition. For this reason many groups are pursuing freestanding GaN wafers as growth substrates. These efforts are still very expensive and limited by the size of the freestanding wafer. Alternatively, hydride vapor phase epitaxy (HVPE) has allowed for the creation of moderately thick (10 to 20 microns) layers of GaN on sapphire with reasonably high crystal quality. The stresses in such layers, however, lead to strains such as wafer bowing that make subsequent processing difficult, especially if traditional planar lithography or wafer-bonding steps are required.

It is well known that etching process steps subsequent to film deposition can modify the semiconductor layers formed on a growth substrate. Laser processing, for example, has been used to etch grooves in GaN layers deposited on sapphire as well as other transparent growth substrates. Pulsed lasers such as frequency-tripled or frequency-quadrupled yttrium aluminum garnet (YAG) lasers and excimer lasers can be utilized. Sufficient energy from the laser beam is present to dice GaN layers into individual LED dies via a localized ablation process.

Researchers at the University of California at Berkeley have also developed a process called laser liftoff whereby the entire GaN layer or array of GaN LED dies can be removed from an optically transparent growth substrate such as sapphire. For example, a sapphire wafer can be coated with the appropriate GaN semiconductor layers for LED fabrication, including the deposition of at least one of the metal contacts. Individual dies are scribed in the semiconducting layers using a narrow beam laser or by mechanical means. At this stage, the LED dies are still fully attached to the growth substrate. A transfer substrate is attached to the exposed surface of the array of dies opposite the growth substrate. Light from an excimer laser is directed through the bare face of the growth substrate to the semiconductor layer of the LED dies located on the opposite face of the growth substrate. Due to the difference in the absorption coefficients between the sapphire and the GaN at the excimer laser wavelength, the majority of the energy from the laser is preferentially deposited into the interface between the sapphire and the GaN LED dies. This effectively separates the GaN LED dies as a group from the sapphire growth substrate.

Subsequent to laser liftoff, additional metal contacts can be added to the exposed planar surfaces and the dies can be separated from the transfer substrate as individual devices. LED dies produced by the laser liftoff process suffer, however, from significant current spreading issues due to lack of an attached electrically conductive substrate and the thinness of the semiconductor layers. A typical total thickness of the semiconductor layers is approximately 4 microns. Various means of enhancing current spreading have been used for laser liftoff dies including metal grip contacts, transparent conductive coatings and wafer bonding of electrically-conducting, low-absorbing layers such as doped SiC.

In another device fabrication method, epitaxial lateral overgrowth can be used to form isolated single crystal regions within a GaN semiconductor layer. In this approach, epitaxial growth is preferentially biased in the lateral direction across a wafer to form narrow wings of high crystal quality material. However, a very close spacing on the order of 10 microns or so is required between isolated regions. The lateral growth process can make high-quality, small devices a few microns wide but large area devices are difficult to fabricate. The epitaxial lateral overgrowth process is appropriate for fabricating GaN diode lasers but has not proved useful for fabricated large area GaN LEDs.

In order to reduce current spreading issues in light emitting diodes and to produce devices that are on the order of one square millimeter or larger in area, there exists a need for LEDs with at least one thick semiconductor layer. In order to increase the light extraction efficiency of such a device, there also exists a need to position one of the two electrodes for such the device on the edge surfaces of the thick semiconductor layer rather than on the planar top or bottom surfaces of the layer.

In addition, there exists a need for a fabrication process whereby thicker, high-quality semiconductor layers and devices can be economically fabricated. Presently, more traditional patterning approaches are used, including the use of mask based lithography and etching processes. Unfortunately, nitride based devices in particular are difficult to etch, especially anisotropically. Etch rates on the order of hundreds of nm/minute limit the feature thicknesses that can be economically rendered in these materials. As such, the use of mechanical means such as dicing and laser scribing are typically used even in thin devices. Conversely, there is a desire to increase the thickness of at least one layer as stated earlier for current spreading considerations. Therefore, there exists a need for an improved high-speed method for patterning light emitting diodes. Such a fabrication process should also be able to operate on wafers that are bowed as well as on planar wafers.

Finally, there is a need for an improved interconnect means. Presently most LEDs are connected via a top wirebond or a flipchip design. In the case of wirebonds, light generated under the bond pad is usually lost or significantly reduced due to simple blockage. In addition, the typical material of choice is gold, which can lead to absorption of reflected rays even if the rays do escape from the die itself. Lastly, wirebonds necessitate the use of some form of strain relief, especially in high current devices. This limits optical design flexibility by typically requiring the use of a large polymer lens. Flip chip designs, conversely, eliminate the top wirebond issues but create issues related to reduced emission area and less than optimum current spreading. There exists the need for an alternate interconnect scheme that minimizes loss of active area while not requiring any top contact. Such a solution should allow for the use of thicker device layers and be compatible with laser liftoff approaches.

SUMMARY OF THE INVENTION

One embodiment of this invention is at least one light emitting diode that is comprised of a first doped semiconductor layer, an active region underlying the first doped semiconductor layer and a second doped semiconductor layer underlying the active region. The first doped semiconductor layer has a first surface, a second surface opposite and substantially parallel to the first surface and an edge surface that connects the first surface and the second surface. In addition, the first doped semiconductor layer is a current spreading layer and has a first area in a plane substantially parallel to the second surface. The active region emits light and has a second area substantially parallel to second surface, where the second area is less than the first area.

The first electrode is in contact with the edge surfaces of the first doped semiconductor layer and the second reflective electrode underlying and in contact with the second doped semiconductor layer. The second electrode includes an optically transparent layer underlying the second doped semiconductor layer and a reflective conductive metallic layer underlying the transparent layer. The transparent layer can be an electrically insulating layer or an electrically conductive layer. If the transparent layer is an electrically insulating layer, the second electrode also includes a plurality of electrically conductive contacts extending from the reflective conductive metallic layer through the electrically insulating layer. The second electrode may optionally include an electrically conductive and optically transparent current spreading layer positioned between the second doped semiconductor layer and the transparent layer. The optional current spreading layer improves electrical current flow from the conductive contacts to the second doped semiconductor layer.

In another embodiment of this invention, the first doped semiconductor layer is an n-doped semiconductor layer and the second doped layer is a p-doped layer. The n-doped layer can be formed by hydride vapor phase epitaxy.

In other embodiments of this invention, the light emitting diode device is a plurality of light emitting diodes. The plurality of light emitting diodes can be a linear array of light emitting diodes or a two-dimensional array of light emitting diodes.

In another embodiment of this invention, a two-dimensional array of light emitting diodes is comprised of columns of light emitting diodes and rows of light emitting diodes. Within the two-dimensional array of light emitting diodes, the first electrodes in a column of light emitting diodes are connected together and the second electrodes in a row of light emitting diodes are connected together. Applying a current to a first electrode of a column and a second electrode of a row causes the light emitting diode located at the intersection of the column and the row to emit light.

Another embodiment of this invention is a method for fabricating at least one light emitting diode. The method comprises: providing a growth substrate, depositing a first doped semiconductor layer onto one surface of the growth substrate, depositing an active region on the first doped semiconductor layer, depositing a second doped semiconductor layer on the active region and depositing a transparent layer on the second doped semiconductor layer. Optionally, an array of vias is etched through the transparent layer. A first array of parallel trenches is etched through the first doped semiconductor layer, the active region, the second doped semiconductor layer and the transparent layer. A second array of parallel trenches is etched through the first doped semiconductor layer, the active region, the second doped semiconductor layer and the transparent layer, whereby the second array of parallel trenches is substantially perpendicular to the first array of parallel trenches. The first and second arrays of parallel trenches form isolated semiconductor dies. A metal layer is deposited on the exposed surfaces of the dies and the growth substrate. Along the edges of the dies, a laser etching process removes the metal layer, the transparent layer, the second doped semiconductor layer and the active layer from each die. The resulting structures are LED dies, each die having two separate electrodes. One of the electrodes is on the edge surface of the first doped semiconductor layer.

These embodiments are enabled by the use of thicker layers available from HVPE type growths. In this case, there exists sufficient thickness within the device such that adequate contact area can be formed on the edges or sides of the die. In addition, the thicker layers enable the use of laser ablation techniques. Typically tolerances on the order of a micron or less are needed in such processes. This is difficult to control if the device layers are only a few microns thick. However if the devices are 10 or 20 microns thick, realistic depth tolerance can be realized. Lastly, any rapid removal process such as laser ablation creates some level of stress locally. The thicker layers are sufficiently robust to prevent cracking and chipping when a portion of the thickness is removed.

BRIEF DESCRIPTION OF THE DRAWINGS

A more detailed understanding of the present invention, as well as other objects and advantages thereof not enumerated herein, will become apparent upon consideration of the following detailed description and accompanying drawings, wherein:

FIG. 1A illustrates a top plane view of a light emitting diode. FIG. 1B is a cross-sectional view along the I-I plane of the light emitting diode illustrated in FIG. 1A. FIG. 1C is another cross-sectional view of the light emitting diode along the I-I plane. FIG. 1D is a cross-sectional view of the second reflective electrode along the II-II plane of the light emitting diode illustrated in FIG. 1C. FIG. 1E is a cross-sectional view illustrating an alternate second reflective electrode of the light emitting diode illustrated in FIG. 1A. FIG. 1F is a cross-sectional view illustrating another alternate second reflective electrode of the light emitting diode illustrated in FIG. 1A. FIG. 1G is another cross-sectional view along the I-I plane of the light emitting diode illustrated in FIG. 1A and illustrates example emitted light rays. FIG. 1H is a cross-sectional view of a light emitting diode of this invention that has angled sidewalls. FIG. 1I is a cross-sectional view of a light emitting diode of this invention that has curved sidewalls.

FIG. 5A is a bottom plane view of the linear array. FIG. 5B is a cross-sectional view of the linear array along the I-I plane indicated in FIG. 5A.

FIG. 6A is a bottom plane view of the two-dimensional array. FIG. 6B is a cross-sectional view of the two-dimensional array along the I-I plane indicated in FIG. 6A.

FIG. 7A is a bottom plane view of the two-dimensional array. FIG. 7B is a cross-sectional view of the two-dimensional array along the I-I plane indicated in FIG. 7A.

FIG. 12A is a top plane view of an assembly shown in FIG. 11B of this invention indicating where etching will take place for a first array of trenches. FIG. 12B is a cross-sectional view in the I-I plane of the assembly illustrated in FIG. 12A.

FIG. 13A is a top plane view of an assembly shown in FIG. 12 that has a first array of etched trenches. FIG. 13B is a cross-sectional view in the I-I plane of the assembly illustrated in FIG. 13A.

FIG. 14A is a top plane view of an assembly of this invention shown in FIG. 13 indicating where etching will take place for a second array of trenches. FIG. 14B is a cross-sectional view in the II-II plane of the assembly illustrated in FIG. 14A.

FIG. 15A is a top plane view of an assembly shown in FIG. 14 of this invention illustrating first and second arrays of etched trenches. FIG. 15B is a cross-sectional view in the II-II plane of the assembly illustrated in FIG. 15A.

FIG. 16A is a top plane view of an assembly shown in FIG. 15 of this invention that is coated with a metal layer. FIG. 16B is a cross-sectional view in the I-I plane of the assembly illustrated in FIG. 16A.

FIG. 17A is a top plane view of an assembly shown in FIG. 16 of this invention indicating where etching will take place. FIG. 17B is a cross-sectional view in the I-I plane of the assembly illustrated in FIG. 17A.

FIG. 18A is a top plane view of an assembly shown in FIG. 17 of this invention after etching has taken place. FIG. 18B is a cross-sectional view in the I-I plane of the assembly illustrated in FIG. 18A.

FIG. 19A again illustrates the cross-sectional view of the assembly shown in FIG. 18B. FIG. 19B illustrates the attachment of a transfer substrate. FIG. 19C illustrates the use of laser light to detach the growth substrate via a liftoff process. FIG. 19D shows the assembly after the growth substrate is removed.

FIG. 20A is a top plane view. FIG. 20B is a cross-sectional view along the I-I plane illustrated in FIG. 20A. Dashed lines show the edges of areas where the metal layer will be removed.

FIG. 21A is a top plane view of the assembly. FIG. 21B is a cross-sectional view along the I-I plane illustrated in FIG. 21A.

FIGS. 22A-22B again illustrates the assembly shown in FIGS. 21A-21B. FIG. 22A is a top plane view. FIG. 22B is a cross-sectional view along the II-II plane illustrated in FIG. 22A. Dashed lines show the edges of areas where the metal layer will be removed.

FIG. 23A is a top plane view of the assembly. FIG. 23B is a cross-sectional view along the I-I plane illustrated in FIG. 23A.

DETAILED DESCRIPTION OF THE PREFERRED EMBODIMENTS

The preferred embodiments of the present invention will be better understood by those skilled in the art by reference to the above figures. The preferred embodiments of this invention illustrated in the figures are not intended to be exhaustive or to limit the invention to the precise form disclosed. The figures are chosen to describe or to best explain the principles of the invention and its applicable and practical use to thereby enable others skilled in the art to best utilize the invention.

The figures are not drawn to scale. In particular, the thickness dimension is expanded relative to the length and width dimensions in order to clearly illustrate the multiple layers of the devices.

Figure 1A:
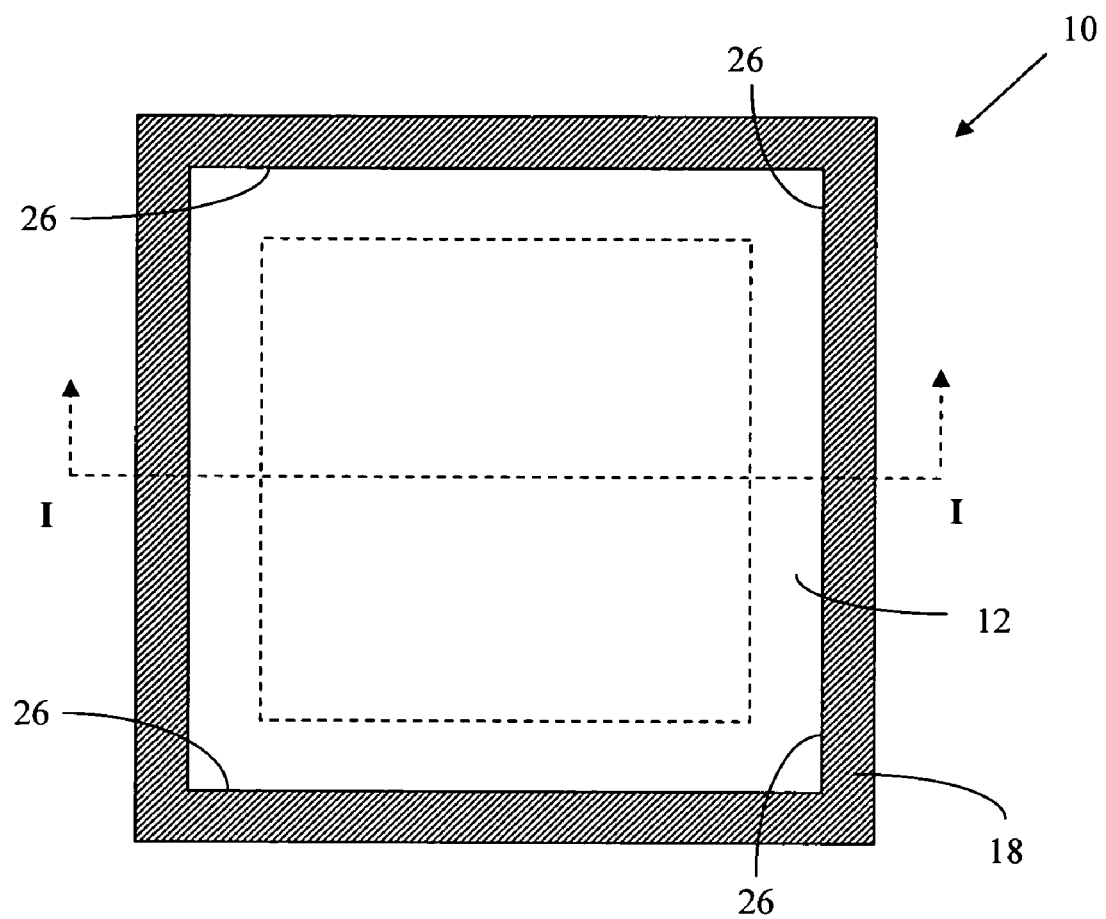
FIGS. 1A-1I illustrate a light emitting diode of this invention.
Figure 1B:
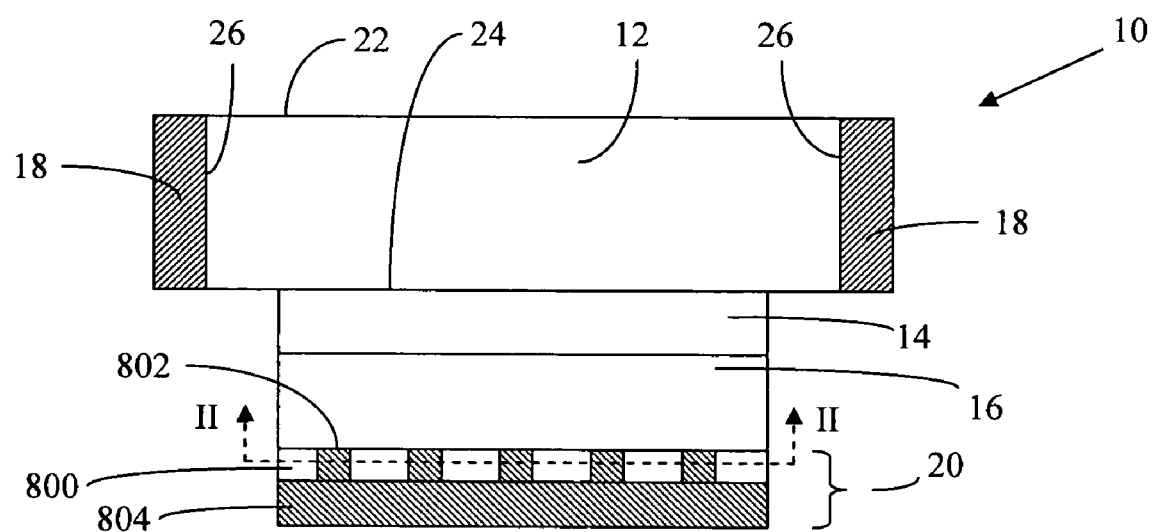
Figure 1C:
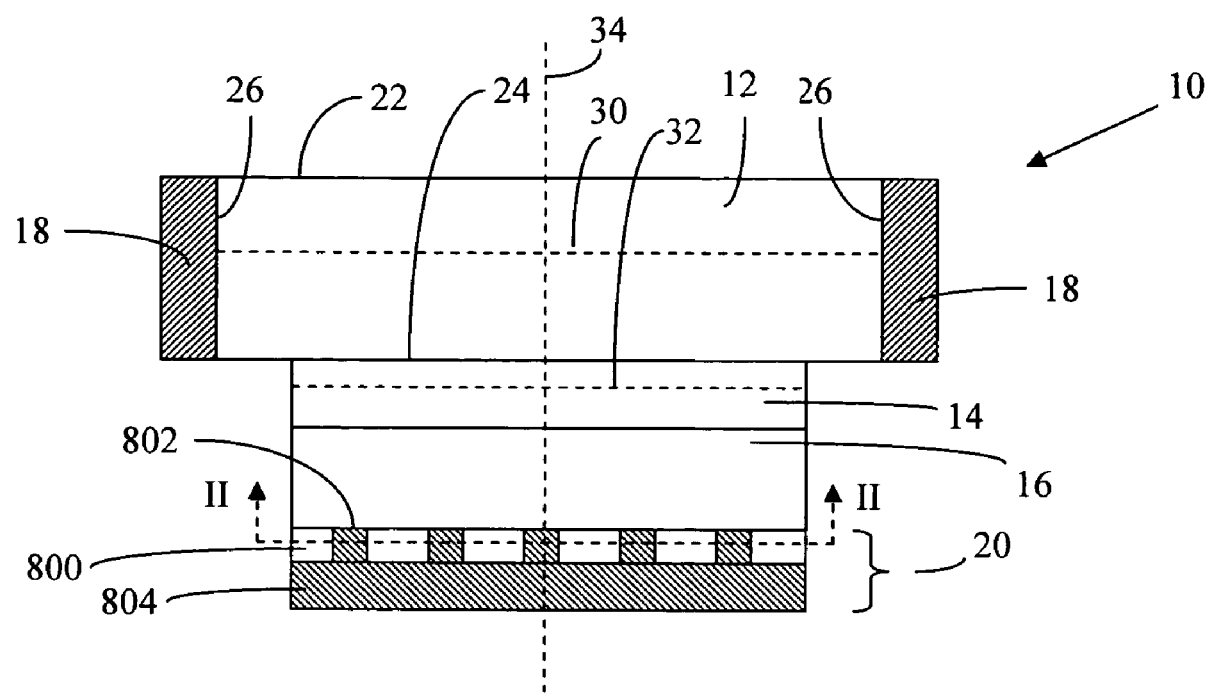
Figure 1D:
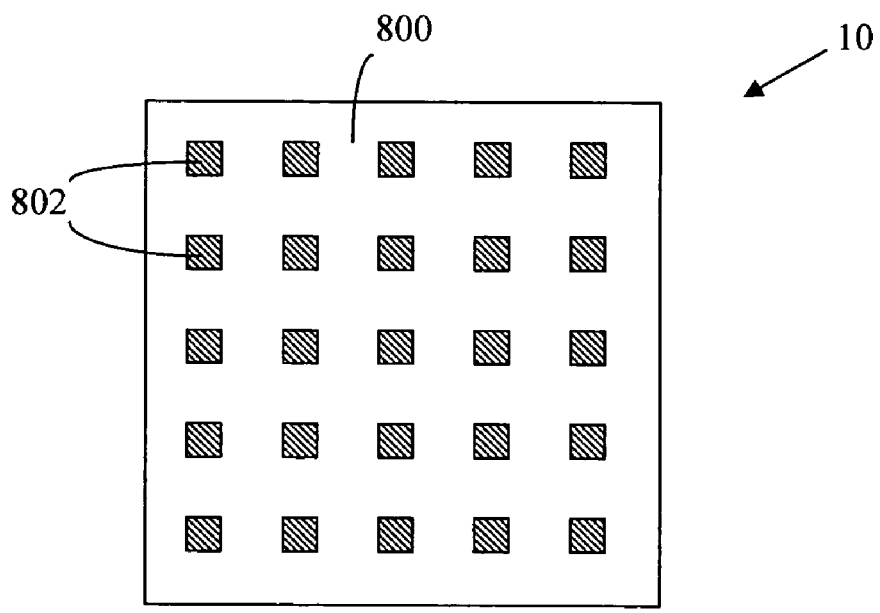
Figure 1E:
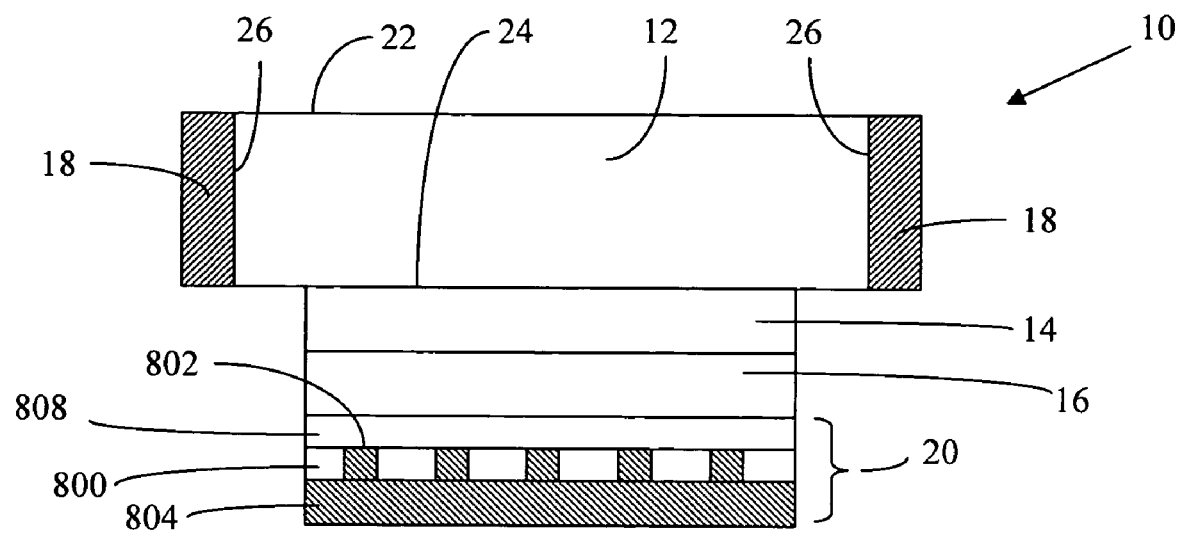
Figure 1F:
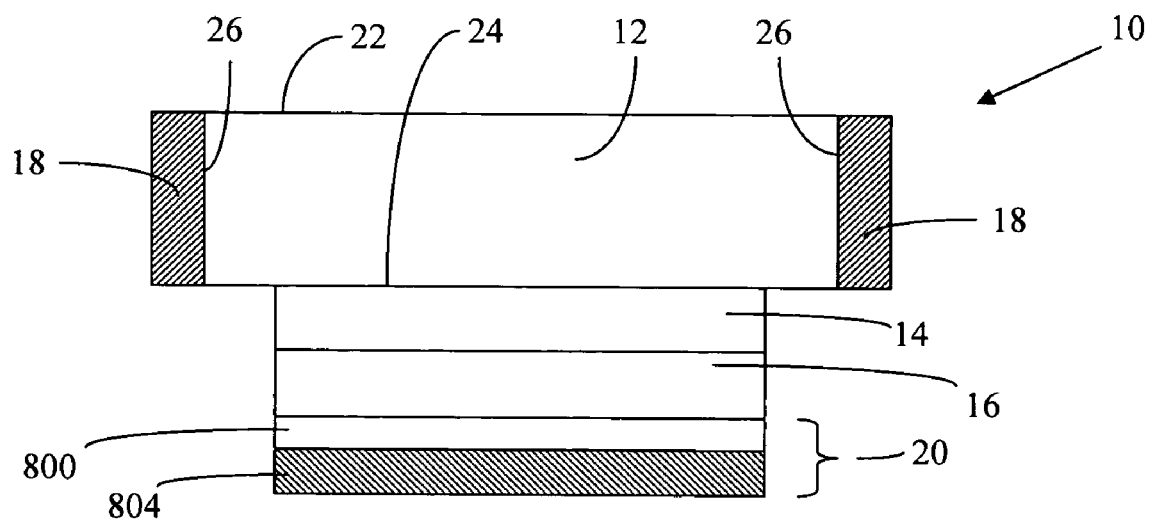
Figure 1G:
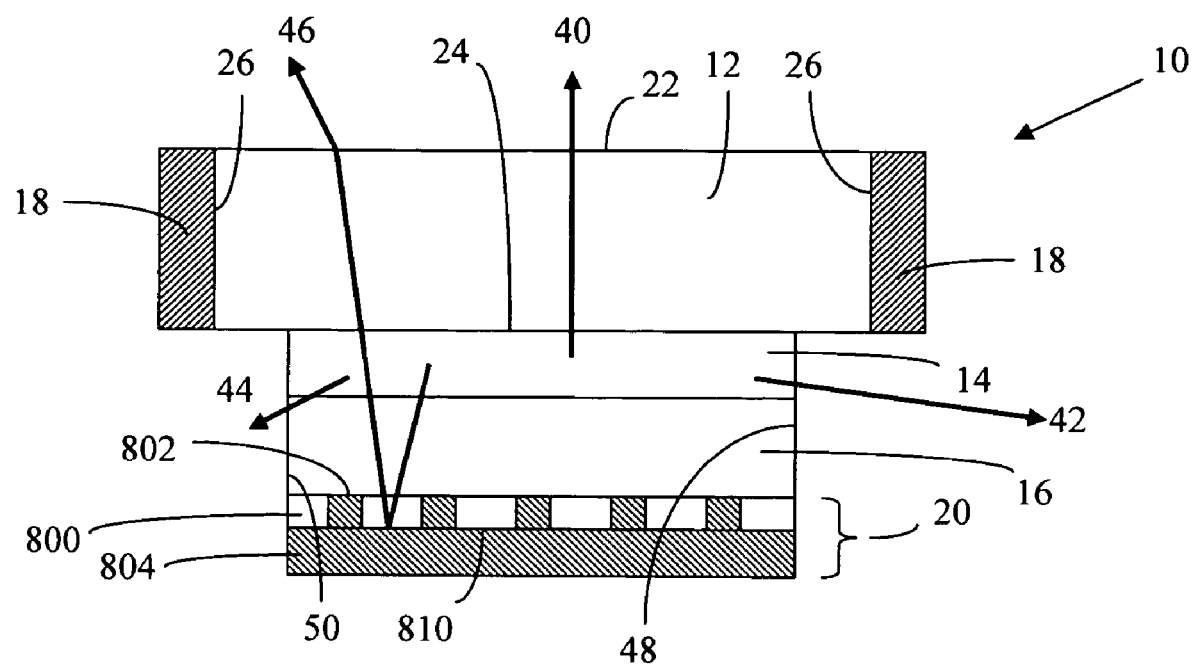
Figure 1H:
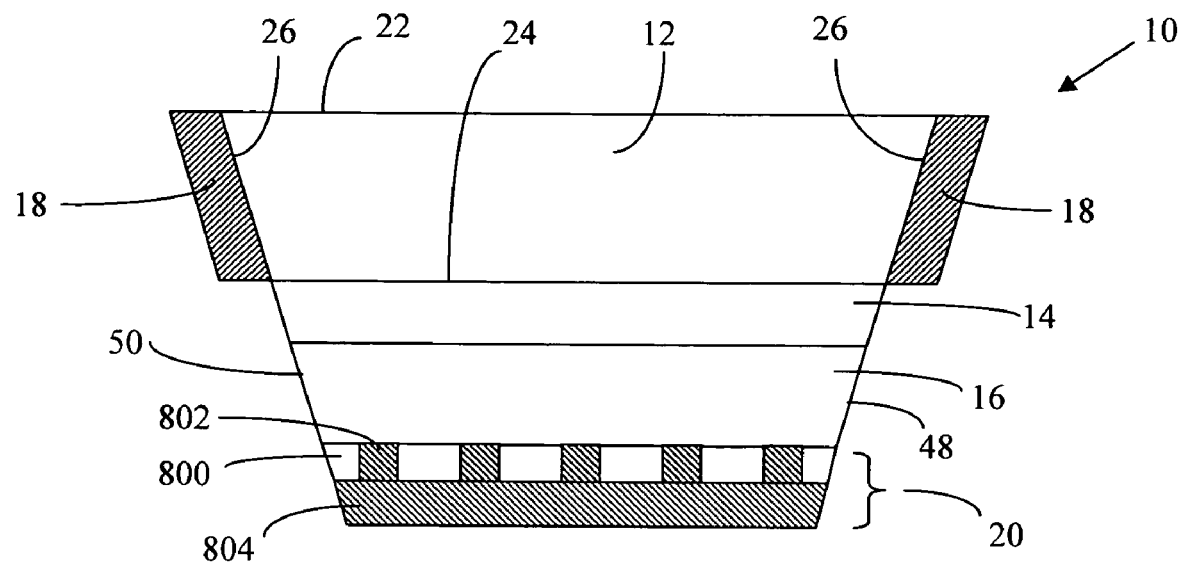
Figure 1I:
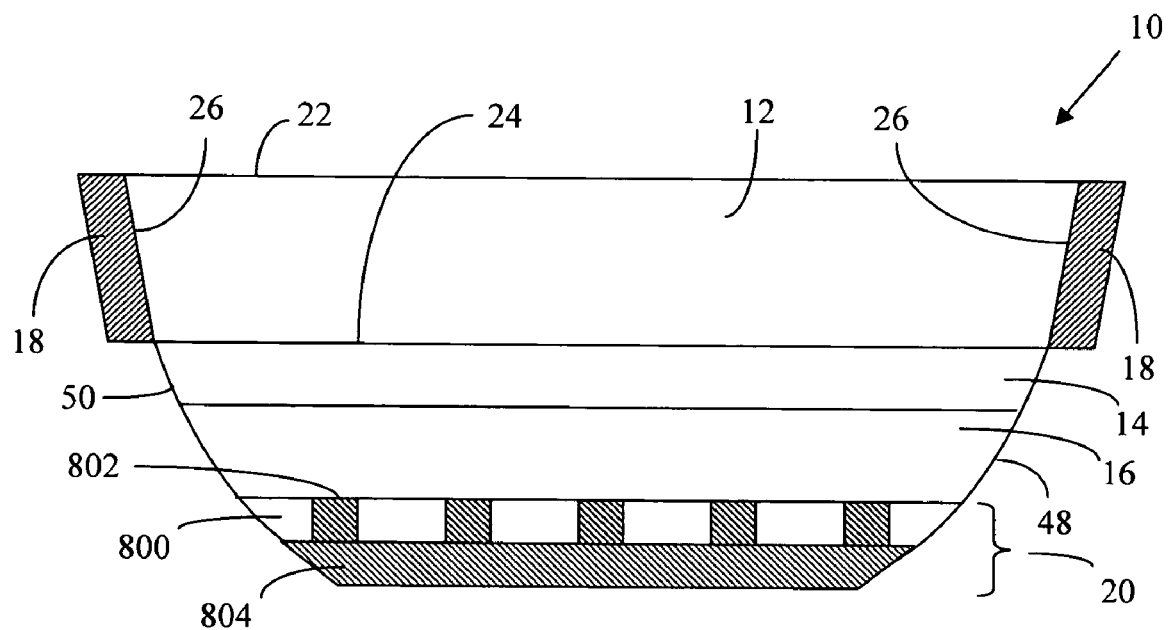

FIGS. 1A-1I illustrate one embodiment of this invention. FIG. 1A illustrates a top plane view of a light emitting diode 10 of this invention. FIG. 1B is a cross-sectional view along the I-I plane of the light emitting diode 10 illustrated in FIG. 1A. FIG. 1C is another cross-sectional view of the light emitting diode 10 along the I-I plane. FIG. 1D is a cross-sectional view of the second reflective electrode along the II-II plane of the light emitting diode illustrated in FIG. 1B and FIG. 1C. FIG. 1E is a cross-sectional view illustrating an alternate second reflective electrode of the light emitting diode illustrated in FIG. 1A. FIG. 1F is a cross-sectional view illustrating another alternate second reflective electrode of the light emitting diode illustrated in FIG. 1A. FIG. 1G is another cross-sectional view along the I-I plane of the light emitting diode illustrated in FIG. 1A and illustrates example emitted light rays. FIG. 1H is a cross-sectional view of a light emitting diode 10 of this invention that has angled sidewalls. FIG. 1I is a cross-sectional view of a light emitting diode 10 of this invention that has curved sidewalls.

FIG. 1A is a plane view of light emitting diode 10 of this invention and FIGS. 1B-1C and FIGS. 1E-1I are cross-sectional views of various embodiments of light emitting diode 10 along the I-I plane illustrated in FIG. 1A. Light emitting diode 10 is comprised of a first doped semiconductor layer 12, an active region 14 underlying the first doped semiconductor layer 12, a second doped semiconductor layer 16 underlying the active region 14, a first electrode 18 in contact with the edge surfaces 26 of the first semiconductor layer and a second electrode 20 underlying the second doped semiconductor layer. Applying an electric current through the device from the first electrode 18 to the second electrode 20 causes the active region 14 to emit light.

The first doped semiconductor layer 12 has a first surface 22, a second surface 24 opposite and substantially parallel to the first surface 22 and edge surfaces 26 that connect the first surface 22 and the second surface 24. The edge surfaces 26 are generally smaller in area and shorter in width than the first surface 22 and the second surface 24. The edge surfaces 26 may be perpendicular to the first surface 22 and the second surface 24 or the edge surfaces 26 may be angled with respect to the first surface and the second surface. The first doped semiconductor layer 12 is a current spreading layer and has a first sectional area 30 in a plane substantially parallel to the first surface 22 and the second surface 24 as shown in FIG. 1C. In order to increase the current spreading capability of the first doped semiconductor layer 12, preferably the first doped semiconductor layer is greater than 2 microns thick in the direction perpendicular to plane 30. More preferably, the thickness of the first doped semiconductor layer is greater than 5 microns thick. Most preferably, the thickness of the first doped semiconductor layer is greater than 10 microns thick.

The first surface 22 and the second surface 24 of the first doped semiconductor layer are substantially parallel. However, when the first doped semiconductor layer 12 is relatively thick, e.g. 5-10 microns or greater, the first doped semiconductor layer and the other layers fabricated on the first doped semiconductor layer may be slightly bowed. The bowing results from the fabrication process for making relatively thick semiconductor layers.

The active region 14 emits light when a current is applied to LED 10 through electrodes 18 and 20. The active region has a second sectional area 32 substantially parallel to the first surface 22 and the second surface 24, where the second sectional area 32 (shown in FIG. 1C) is less than the first sectional area 30. The active region 14 can be, for example, a p-n homojunction, a p-n heterojunction, a p-n double heterojunction, a single quantum well or a multiple quantum well, but is not limited to these specific types of junctions.

Light emitting diode 10 may have an axis of symmetry 34 as shown in FIG. 1C, but an axis of symmetry is not required.

The first doped semiconductor layer 12 can be an n-doped semiconductor layer and the second doped semiconductor layer 16 can be a p-doped semiconductor layer. Alternatively, the first doped semiconductor layer 12 can be a p-doped semiconductor layer and the second doped semiconductor layer 16 can be an n-doped semiconductor layer.

The first doped semiconductor layer 12, the active region 14 and the second doped semiconductor layer 16 can be fabricated from a wide variety of semiconductor materials from element groups III-V, II-VI and IV. Such semiconductor materials include the III-V materials used to fabricate LEDs and diode lasers. Example III-V materials include, but are not limited to, gallium nitride (GaN), aluminum nitride (AlN), aluminum gallium nitride (AlGaN), indium nitride (InN), indium gallium nitride (InGaN), aluminum indium gallium nitride (AlInGaN), aluminum gallium indium phosphide (AlGaInP), indium gallium phosphide (InGaP), gallium arsenide (GaAs), indium gallium arsenide (InGaAs) and indium gallium arsenide phosphide (InGaAsP). Example II-VI semiconductor materials include, but are not limited to, zinc oxide (ZnO), zinc sulfide (ZnS), cadmium sulfide (CdS), cadmium selenide (CdSe), cadmium telluride (CdTe) and mercury cadmium telluride (HgCdTe). Example group IV semiconductor materials include silicon (Si) and germanium (Ge).

If LED 10 is a GaN-based device, preferably the first doped semiconductor layer 12 is an n-doped GaN layer and the second doped semiconductor layer 16 is a p-doped GaN layer.

The first electrode 18 is in contact with the edge surfaces 26 of the first doped semiconductor layer 12. The second electrode 20 underlies and is in contact with the second doped semiconductor layer 16. The location of the first electrode 18 on the edge surfaces 26 of the first doped semiconductor layer 16 is a unique aspect of this invention. LEDs of the prior art position the first electrode either on the first surface 22 of the first doped semiconductor material or on the second surface 24 of the first doped semiconductor material. Positioning the first electrode on the edges 26 of the first doped semiconductor layer allows for a greater light emitting area from the first surface 22.

The first electrode 18 can be fabricated from a wide variety of materials. Preferably the electrode materials have a high reflectivity so that light rays directed to the electrode materials will be reflected by the electrode materials. The electrodes may be formed from one or more metals or metal alloys containing, but not limited to, silver, aluminum, nickel, gold, titanium, chromium, platinum, palladium, rhodium, rhenium, ruthenium and tungsten. The electrodes may also be formed from transparent conductive oxides such as indium tin oxide (ITO).

A common electrode material for the top layer of the first electrode in prior art devices is gold. Gold has very good electrical properties, but is a poor optical reflector for visible light. It is advantageous to replace gold with a more reflective material such as silver or aluminum. Preferably the first electrode 18 has a reflectivity greater than 60 percent. More preferably, the first electrode has a reflectivity greater than 80 percent.

The second electrode 20 usually covers a larger portion of the surface of LED 10 than the first electrode. Consequently, the reflectivity of the second electrode is more critical to the output efficiency of LED 10 than the reflectivity of the first electrode. Preferably the reflectivity of the second electrode 20 is greater than 92 percent. More preferably the reflectivity of the second electrode is greater than 96 percent. Most preferably the reflectivity of the second electrode is greater than 98 percent.

The second electrode 20 includes an optically transparent layer 800 and a reflective metal layer 804. The transparent layer 800 can be an electrically insulating layer or an electrically conductive layer. If transparent layer 800 is an electrically insulating layer, then second electrode 20 also includes a plurality of metal contacts 802 extending through the transparent layer 800 from the reflective metal layer 504 as illustrated in FIGS. 1B-1E and FIGS. 1G-1I.

The transparent layer 800 has a low index of refraction, preferably between about 1.10 and 2.25. The transparent layer 800 may be a solid layer or may be a porous layer in order to reduce the index of refraction. If the transparent layer 800 is an electrically insulating layer, the transparent layer can be fabricated, for example, from silicon dioxide ($SiO_2$), silicon nitride ($Si_3N_4$) or magnesium fluoride (MgF), but is not limited to these materials. If the transparent layer 800 is an electrically conductive layer, the transparent layer can be fabricated from, for example, a transparent conductive oxide. Example transparent conductive oxides include, but are not limited to, indium tin oxide (InSnO or ITO), ruthenium oxide (RuO) or nickel zinc oxide (NiZnO). In order to achieve a low index of refraction using a transparent conductive oxide, the transparent conductive oxide may need to be deposited as a porous layer. Porous layers may be formed by using, for example, by electron beam deposition at high angles (greater than 70 degrees).

Preferably the transparent layer 800, whether it is an electrically insulating layer or an electrically conductive layer, is at least a quarter of a wavelength thick for optimized reflectivity. More preferably, the transparent layer 800 is approximately a quarter of a wavelength thick or approximately three-quarters of a wavelength thick.

As illustrated in FIGS. 1B and 1D, for example, the plurality of metal contacts 802 will extend in a patterned array across the entire transparent layer 800 and metal layer 804 of the second reflective electrode 20. The metal contacts provide a low resistance electrical contact with the overlying semiconductor layers and may comprise, for example, a metal composition, such as AuGe—Ni—Au for N-type ohmic contacts and AuZn or AuBe for P-type contacts. It is also possible to make the metal contacts from the same metal as the reflective metal layer 804.

As shown in FIG. 1D, metal contacts 802 comprise a small fraction of the interface area between the second doped semiconductor layer 16 and the reflective metal layer 804. Metal contacts comprise between about 0.25 and 10 percent of the interface area. This small contact surface area increases the portion of light that reaches and is reflected by the underlying reflective metal layer. Increased reflection, in turn, increases the light extraction efficiency of the LED.

Returning to FIG. 1B, reflective metal layer 804 comprises an electrically conductive material that has a high reflectivity, serving as both an electrical contact and a reflector. Suitable materials include silver (Ag) and aluminum (Al). The thickness and low refractive index of the transparent layer 800 coupled with the high reflectivity of reflective metal layer 804 cause nearly all of the light emitted downwardly to be reflected rather than absorbed, enhancing extraction efficiency.

The plurality of metal contacts 802 can be formed by first depositing the transparent layer 800, then patterning of the transparent layer by photolithography to form openings for the metal contacts. The metal contacts would then be formed by a second lithographic process.

FIG. 1E illustrates a side cross-sectional view of another embodiment of this invention. In FIG. 1E, electrode 20 of LED 10 includes an additional transparent current spreading layer 808 that is fabricated between the second doped semiconductor 16 and the transparent layer 800. The transparent current spreading layer 808 spreads the electrical current flowing though the metal contacts 802 to the entire area of the second doped semiconductor layer 16. The transparent current spreading layer is usually less than or equal to a quarter wavelength in thickness and is fabricated from a transparent conductive oxide. Example transparent conductive oxides include, but are not limited to, indium tin oxide (InSnO or ITO), ruthenium oxide (RuO) or nickel zinc oxide (NiZnO).

FIG. 1F illustrates a side cross-sectional view of another embodiment of this invention. In FIG. 1F, electrode 20 of LED 10 includes a transparent layer 800 that is electrically conductive. Since transparent layer 800 is electrically conductive, no metal contacts are needed. Appropriate electrically conductive materials are transparent conductive oxides such as indium tin oxide (InSnO or ITO), ruthenium oxide (RuO) or nickel zinc oxide (NiZnO).

FIG. 1G illustrates example light rays 40, 42, 44 and 46 emitted by the active region 14. Example light ray 40 is emitted by active region 14, passes through the second surface 24, through the first doped semiconductor layer 12 and exits LED 10 through the first surface 22.

Example light ray 42 is emitted by the active region 14 and exits LED 10 through side surface 48. Example light ray 44 is emitted by the active region 14, is directed into the second doped semiconductor layer 16 and exits LED 10 through side surface 50.

Example light ray 46 is emitted by the active region 14, is directed through the second doped semiconductor layer 16 to surface 810 of reflective conductive metallic layer 810 of the second electrode 20. Light ray 46 is reflected by the surface 810, passes through the second doped semiconductor layer a second time, passes through the active region, passes through the first semiconductor layer and exits LED 10 through the first surface 22.

FIG. 1H illustrates a side cross-sectional view of another embodiment of this invention. In FIG. 1H, the side surfaces 48 and 50 of LED 10 are angled. FIG. 1I illustrates a side cross-sectional view of another embodiment of this invention. In FIG. 1I, the side surfaces 48 and 50 of LED 10 are curved. Sides 48 and 50 of LED 10 can be made vertical, angled or curved by varying the lithographic processes used to fabricate LED 10. For example, if LED 10 is fabricated using laser ablation or laser etching processes, the laser beam shape can be controlled to produce vertical, angled or curved sidewalls. Controlling the shape of the LED structure by using angled or curved sidewalls may be advantageous for controlling the deposition of insulating or metal layers on the LED structure.

In FIGS. 2-7 of this specification, second electrode 20 is a multilayer structure that will by represented, for simplicity, as a single layer. However, in FIGS. 2-7, second electrode 20 can be, for example, one of the following: (1) an electrically conducting transparent layer underlying the second doped semiconductor layer and a reflective metallic layer underlying the transparent layer; (2) an insulating transparent layer underlying the second doped semiconductor layer, a reflective metallic layer underlying the transparent layer and an array of metal contacts extending through the transparent layer; or (3) a transparent current spreading layer underlying the second doped semiconductor layer, an insulating transparent layer underlying the transparent current spreading layer, a reflective metallic layer underlying the transparent layer and an array of metal contacts extending through the transparent layer.

Figure 2:
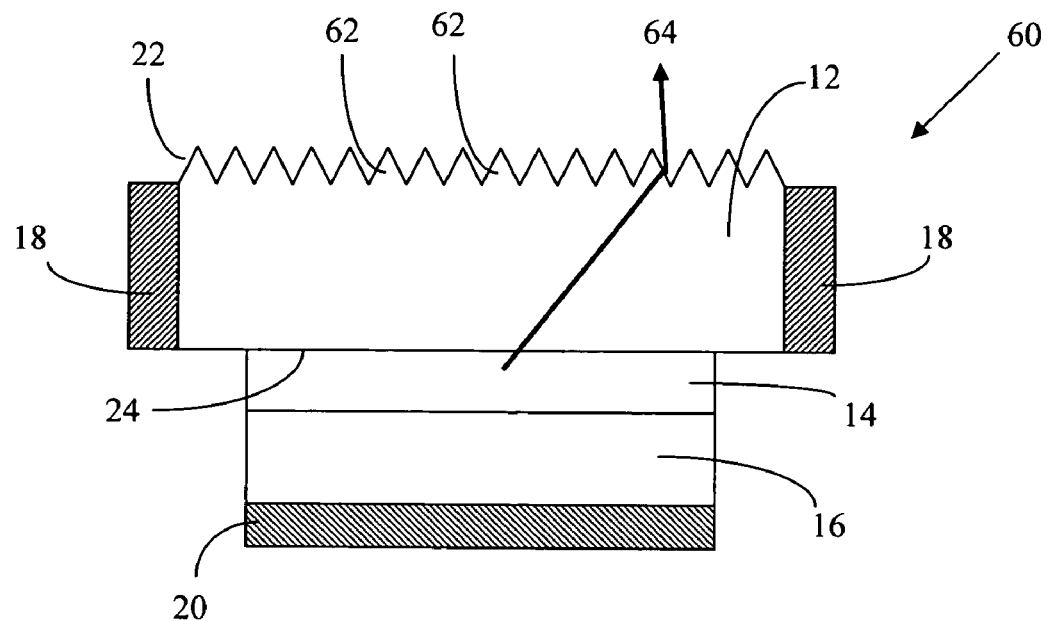
FIG. 2 is a cross-sectional view of another embodiment of this invention that includes light extraction elements.

Another embodiment of the present invention is LED 60 illustrated in cross-section in FIG. 2. LED 60 is similar to LED 10 except that the first surface 22 of the first doped semiconductor layer 12 includes light extracting elements 62. Light extracting elements 62 can be any surface features that improve the light extracting efficiency of LED 60. Light extracting elements 62 can be, for example, pyramids, cones, convex lenses, concave lenses, holes, ridges or grooves, but are not limited to these shapes. The light extracting elements may be fabricated from the material of the first semiconductor layer 12 as shown in FIG. 2 or the light extracting elements may be fabricated from a different material. Especially effective light extracting elements are pyramids and hemispherical lenses etched into the first semiconductor layer. The etching process may be any semiconductor dry or wet etching process including, but not limited to, laser etching, reactive ion etching, plasma etching, wet chemical etching and photoelectrochemical etching.

Example light ray 64 illustrates a possible path of a light ray emitted by the active region 14 of LED 60. Example light ray 64 is emitted by active region 14, is directed through the second surface 24, passes through the first semiconductor layer 12 and exits LED 60 through light extraction elements 62 in the first surface 22.

Figure 3:
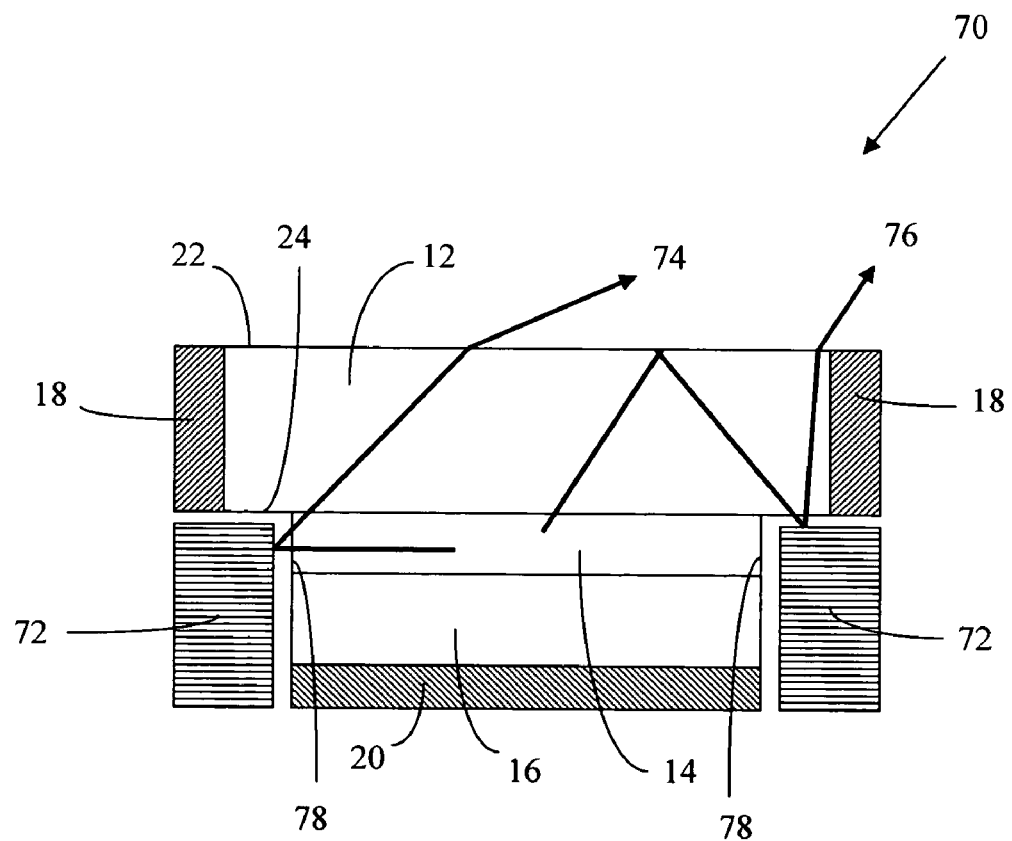
FIG. 3 is a cross-sectional view of another embodiment of this invention that includes additional reflecting elements.

Another embodiment of the present invention is LED 70 illustrated in cross-section in FIG. 3. LED 70 is similar to LED 10 except that LED 70 includes reflectors 72. Reflectors 72 are located adjacent to the first semiconductor layer 12 and the first electrodes 18 and adjacent to edge surfaces 78 of the active region 14 and second semiconductor layer 16. Reflectors 72 reflect light that exits the second surface 24 of the first semiconductor layer and the edge surfaces 78 of the active region and the second semiconductor layer. The reflected light is directed back into the first semiconductor layer, the active region or the second semiconductor layer.

Example light rays 74 and 76 illustrate the utility of reflectors 72. The active region 14 emits example light ray 74. Example light ray 74 passes through edge surface 78, is reflected by reflector 72 and passes through edge surface 78 a second time into the active region 14. Example light ray 74 passes through the active region, passes through the second surface 24, passes through the first semiconductor layer 12 and exits LED 70 through the first surface 22.

Active region 14 emits example light ray 76. Example light ray 76 passes through the second surface 24 a first time, passes through the first semiconductor layer a first time and undergoes total internal reflection at the first surface 22. Example light ray 76 passes through the first semiconductor layer a second time, passes through the second surface 24 a second time and is reflected by reflector 72. Example light ray 76 passes through the second surface 24 a third time, passes through the first semiconductor layer a third time and exits LED 70 through the first surface 22.

Figure 4:
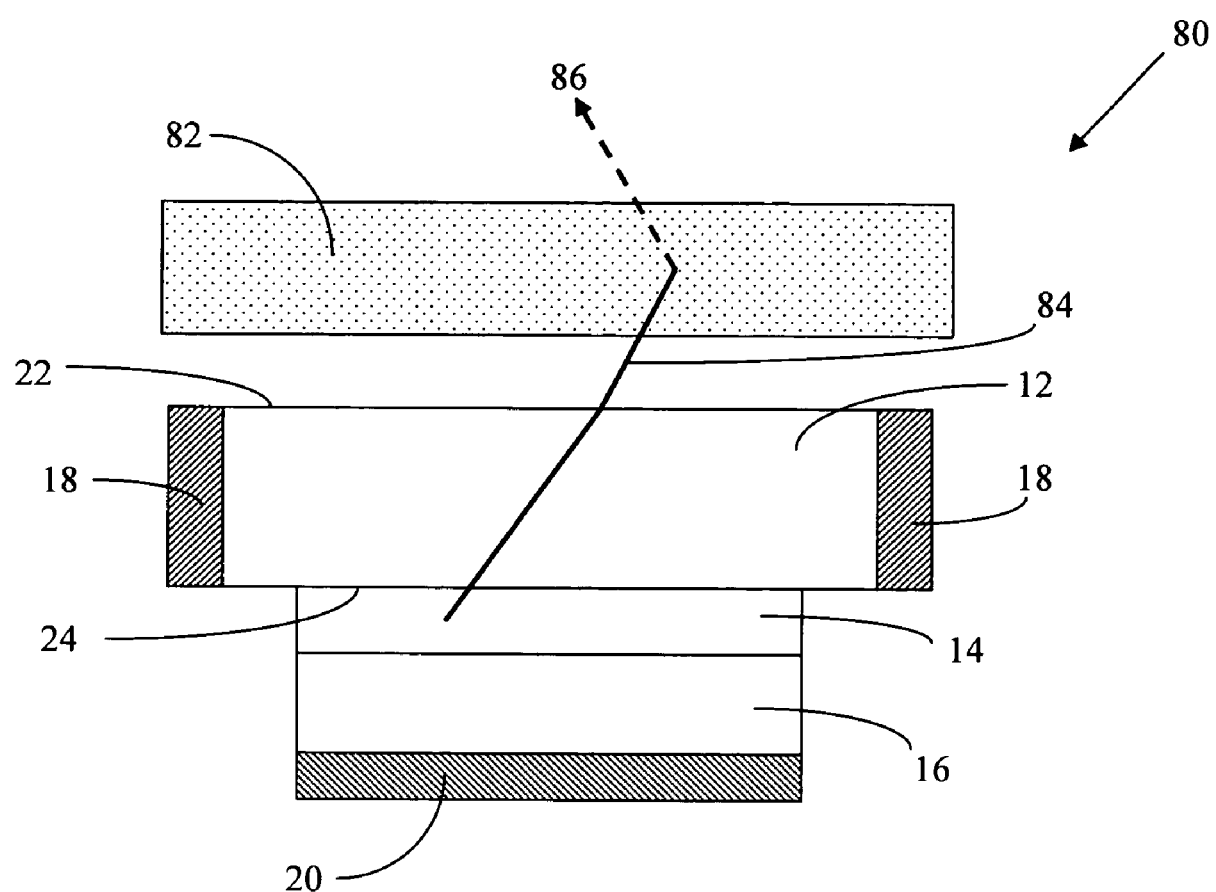
FIG. 4 is a cross-sectional view of another embodiment of this invention that includes a wavelength conversion layer.

FIG. 4 is a cross-sectional view of another embodiment of this invention. LED 80 is similar to LED 10 except that LED 80 includes a wavelength conversion layer 82. Wavelength conversion layer converts light of a first wavelength range emitted by the active region 14 into light of a second wavelength range, where the second wavelength range is different than the first wavelength range.

The wavelength conversion layer 82 includes one or more wavelength conversion materials that facilitate the wavelength conversion. Exemplary wavelength conversion materials can include phosphor materials, quantum dot materials or a plurality of such materials. The phosphor materials may be powdered phosphors, polycrystalline phosphors or single-crystal phosphors. If the phosphor materials are powdered phosphors, the wavelength conversion layer may further comprise a transparent host material into which the phosphor materials or the quantum dot materials are dispersed.

Phosphor materials are typically optical inorganic materials doped with ions of lanthanide (rare earth) elements or, alternatively, ions such as magnesium, calcium, chromium, titanium, vanadium, cobalt or neodymium. The lanthanide elements are lanthanum, cerium, praseodymium, neodymium, promethium, samarium, europium, gadolinium, terbium, dysprosium, holmium, erbium, thulium, ytterbium and lutetium. Optical inorganic materials include, but are not limited to, sapphire ($Al_2O_3$), gallium arsenide (GaAs), beryllium aluminum oxide ($BeAl_2O_4$), magnesium fluoride ($MgF_2$), indium phosphide (InP), gallium phosphide (GaP), yttrium aluminum garnet (YAG or $Y_3Al_5O_{12}$), terbium-containing garnet, yttrium-aluminum-lanthanide oxide compounds, yttrium-aluminum-lanthanide-gallium oxide compounds, yttrium oxide ($Y_2O_3$), calcium or strontium or barium halophosphates $(Ca,Sr,Ba)_5(PO_4)_3(Cl,F)$, the compound $CeMgAl_{11}O_{19}$, lanthanum phosphate ($LaPO_4$), lanthanide pentaborate materials ($(lanthanide)(Mg,Zn)B_5O_{10}$), the compound $BaMgAl_{10}O_{17}$, the compound $SrGa_2S_4$, the compounds $(Sr,Mg,Ca,Ba)(Ga,Al,In)_2S_4$, the compound SrS, the compound ZnS and nitridosilicate. There are several exemplary phosphors that can be excited at 250 nm or thereabouts. An exemplary red emitting phosphor is $Y_2O_3:Eu^{3+}$. An exemplary yellow emitting phosphor is $YAG:Ce^{3+}$. Exemplary green emitting phosphors include $CeMgAl_{11}O_{19}:Tb^{3+}$, $((lanthanide)PO_4:Ce^{3+},Tb^{3+})$ and $GdMgB_5O_{10}:Ce^{3+},Tb^{3+}$. Exemplary blue emitting phosphors are $BaMgAl_{10}O_{17}:Eu^{2+}$ and $(Sr,Ba,Ca)_5(PO_4)_3Cl:Eu^{2+}$. For longer wavelength LED excitation in the 400-450 nm wavelength region or thereabouts, exemplary optical inorganic materials include yttrium aluminum garnet (YAG or $Y_3Al_5O_{12}$), $Y_{1-a}Gd_a)_3(Al_{1-b}Ga_b)_5O_{12}$, terbium-containing garnet, yttrium oxide ($Y_2O_3$), $YVO_4$, $SrGa_2S_4$, $(Sr,Mg,Ca,Ba)(Ga,Al,In)_2S_4$, SrS, and nitridosilicate. Exemplary phosphors for LED excitation in the 400-450 nm wavelength region include $YAG:Ce^{3+}$, $(Y_{1-a}Gd_a)_3(Al_{1-b}Ga_b)_5O_{12}:Ce^{3+}$, $YAG:Ho^{3+}$, $YAG:Pr^{3+}$, $SrGa_2S_4:Eu^{2+}$, $SrGa_2S_4:Ce^{3+}$, $SrS:Eu^{2+}$ and nitridosilicates doped with $Eu^{2+}$.

Quantum dot materials are small particles of inorganic semiconductors having particle sizes less than about 30 nanometers. Exemplary quantum dot materials include, but are not limited to, small particles of CdS, CdSe, ZnSe, InAs, GaAs and GaN. Quantum dot materials can absorb light at one wavelength and then re-emit the light at different wavelengths that depend on the particle size, the particle surface properties, and the inorganic semiconductor material.

The transparent host materials include polymer materials and inorganic materials. The polymer materials include, but are not limited to, acrylates, polystyrene, polycarbonate, fluoroacrylates, perfluoroacrylates, fluorophosphinate polymers, fluorinated polyimides, polytetrafluoroethylene, fluorosilicones, sol-gels, epoxies, thermoplastics, thermosetting plastics and silicones. Fluorinated polymers are especially useful at ultraviolet wavelengths less than 400 nanometers and infrared wavelengths greater than 700 nanometers owing to their low light absorption in those wavelength ranges. Exemplary inorganic materials include, but are not limited to, silicon dioxide, optical glasses and chalcogenide glasses.

A single type of phosphor material or quantum dot material may be incorporated in the wavelength conversion layer or a mixture of phosphor materials and quantum dot materials may be incorporated into the wavelength conversion layer. Utilizing a mixture of more than one such material is advantageous if a broad spectral emission range is desired.

Example light rays 84 and 86 in FIG. 4 illustrate the function of the wavelength conversion layer 82. The active region 14 emits example light ray 84 of a first wavelength range. Example light ray 84 of a first wavelength range passes through the second surface 24, passes through the first semiconductor layer 12 and passes through the first surface 22. Example light ray 84 of a first wavelength range enters the wavelength conversion layer 82 and is converted to light ray 86 of a second wavelength range. Light ray 86 of a second wavelength range exits the wavelength conversion layer 82 and LED 80.

Figure 5A:
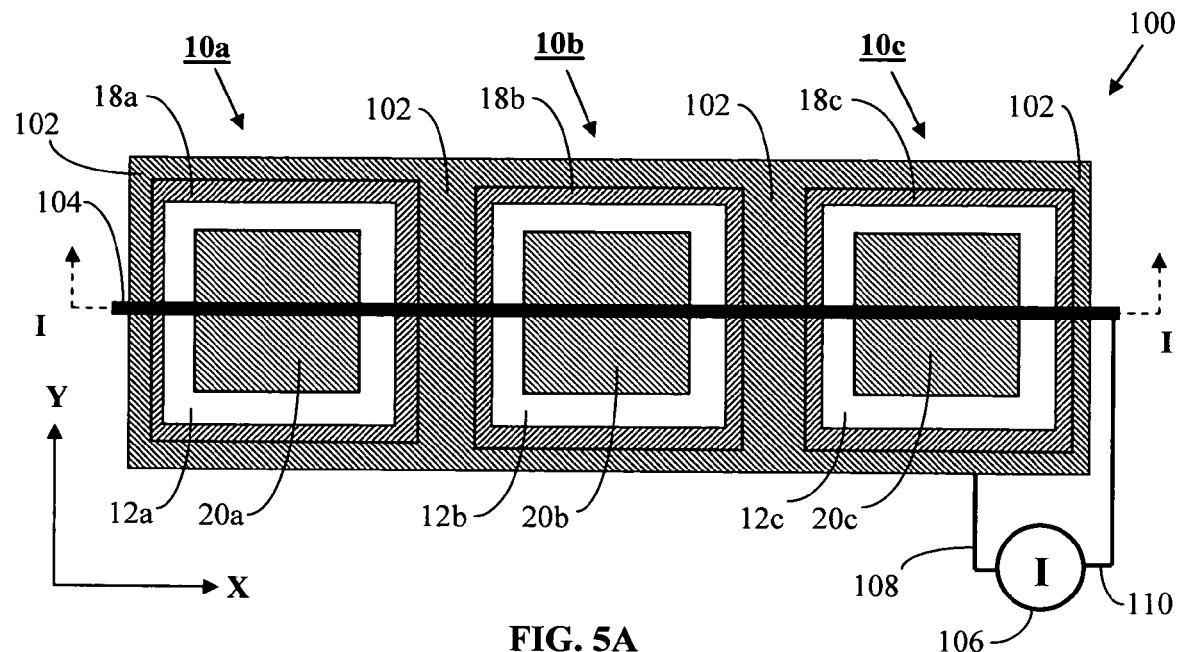
FIG. 5A-5B illustrate another embodiment of this invention that is a linear array of three light emitting diodes.
Figure 5B:
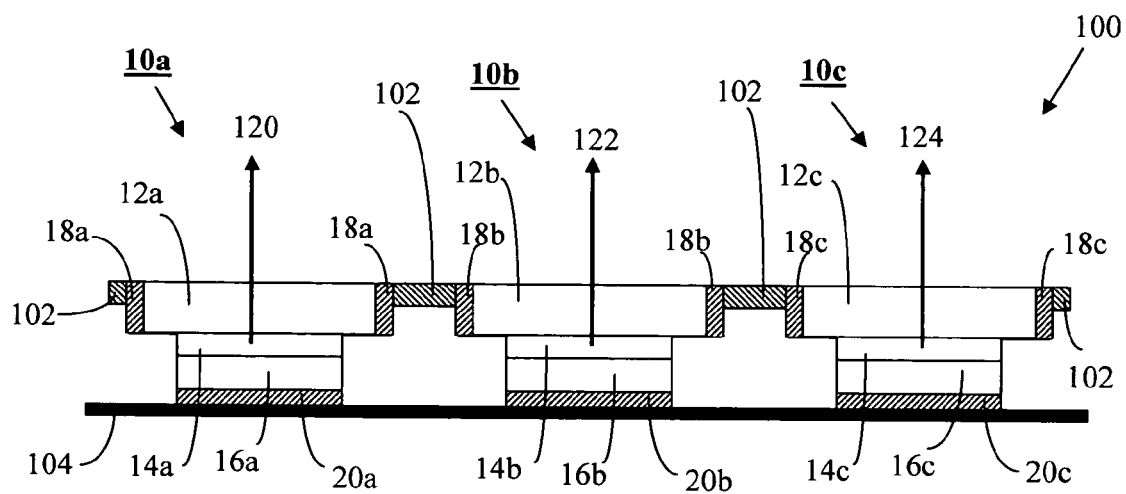

FIG. 5A illustrates a bottom plane view of another embodiment of this invention that includes a plurality of LEDs. FIG. 5B illustrates a cross-sectional view of this embodiment along the I-I plane indicated in FIG. 5A. In this example, the plurality of LEDs is a linear array 100 of three LEDs. The LEDs are labeled 10a, 10b and 10c. The linear array 100 of three LEDs is an example for illustrative purposes. The linear array may contain two LEDs, three LEDs or more than three LEDs. LEDs 10a, 10b and 10c in FIGS. 5A and 5B are structurally and functionally identical to LED 10 in FIGS. 1A and 1B. Each LED in FIGS. 5A and 5B has a first semiconductor layer (12a, 12b or 12c), an active region (14a, 14b or 14c), a second semiconductor layer (16a, 16b or 16c), a first electrode (18a, 18b or 18c) and a second electrode (20a, 20b or 20c). The second electrodes are multilayer structures.

The first electrodes (18a, 18b and 18c) of LEDs 10a, 10b and 10c in the linear array 100 are electrically connected via electrode 102. Electrode 102 is fabricated from the same material as the first electrodes 18a, 18b and 18c as well as electrode 18 in FIGS. 1A and 1B.

The second electrodes (20a, 20b and 20c) of LEDs 10a, 10b and 10c in the linear array 100 are electrically connected via electrode 104. Electrode 104 is fabricated from any electrically conducting metal. The connections may be made, for example, by wire bonding. Suitable metals were previously listed for electrodes 18 and 20 of LED 10 in FIGS. 1A and 1B.

A current source 106 is attached to the linear array 100 via electrically conducting wires 108 and 110. When the proper current is applied to the linear array 100 by current source 106, all three LEDs (10a, 10b and 10c) will emit light. Illustrative light rays 120, 122 and 124 indicate light emission from LEDs 10a, 10b and 10c, respectively.

Figure 6A:
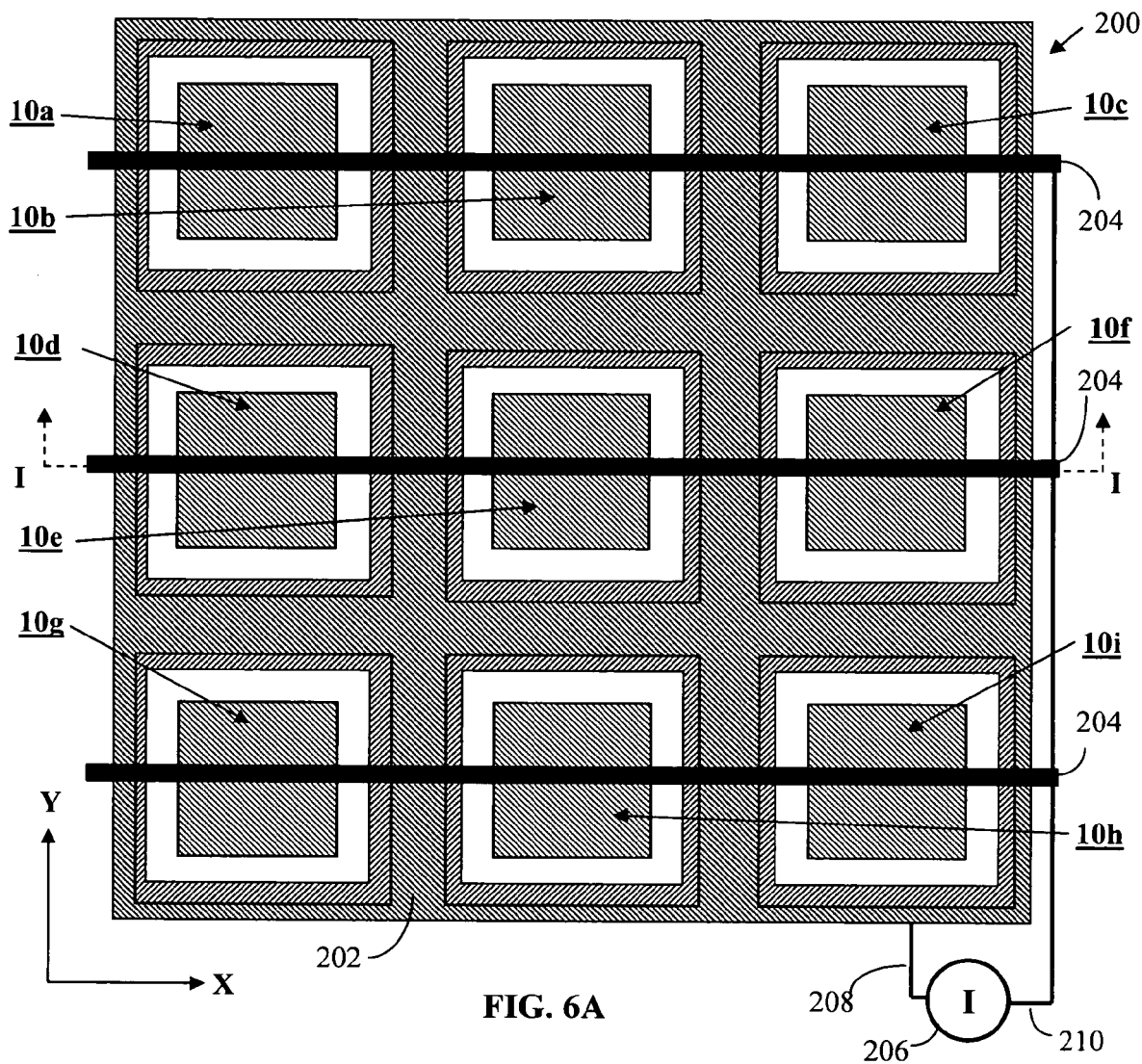
FIG. 6A-6B illustrate another embodiment of this invention that is a two-dimensional array of nine light emitting diodes.
Figure 6B:
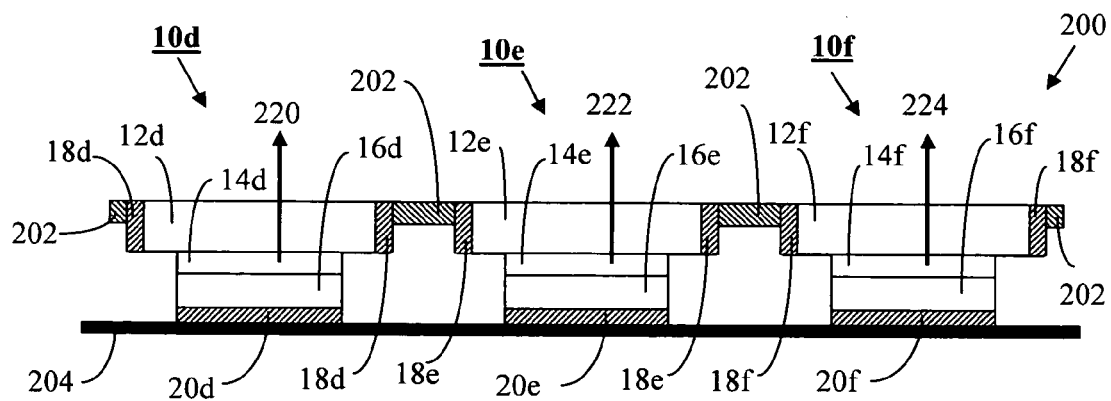

FIG. 6A illustrates a bottom plane view of another embodiment of this invention that includes a plurality of LEDs. FIG. 6B illustrates a cross-sectional view of this embodiment along the I-I plane indicated in FIG. 6A. In this example, the plurality of LEDs is a two-dimensional array 200 of nine LEDs. The LEDs are labeled 10a, 10b, 10c, 10d, 10e, 10f, 10g, 10h and 10i. The three LEDs shown in the cross-sectional view in FIG. 6B are 10d, 10e and 10f. The two-dimension array 200 of nine LEDs is an example for illustrative purposes. The two-dimensional array may contain four LEDs or more than four LEDs. The two-dimensional array may be a square-shaped array, a rectangular-shaped array or any other shape that contains at least two LEDs in each dimension. LEDs 10a, 10b, 10c, 10d, 10e, 10f, 10g, 10h and 10i in FIGS. 6A and 6B are structurally and functionally identical to LED 10 in FIGS. 1A and 1B. Each LED in FIGS. 6A and 6B has a first semiconductor layer (12a, 12b, 12c, 12d, 12e, 12f, 12g, 12h or 12i), an active region (14a, 14b, 14c, 14d, 14e, 14f, 14g, 14h or 14i), a second semiconductor layer (16a, 16b, 16c, 16d, 16e, 16f, 16g, 16h or 16i), a first electrode (18a, 18b, 18c, 18d, 18e, 18f, 18g, 18h or 18i) and a second electrode (20a, 20b, 20c, 20d, 20e, 20f, 20g, 20h or 20i). The second electrodes are multilayer structures.

The first electrodes (18a, 18b, 18c, 18d, 18e, 18f, 18g, 18h and 18i) of LEDs 10a, 10b, 10c, 10d, 10e, 10f, 10g, 10h and 10i in the two-dimensional array 200 are electrically connected via electrodes 202. Electrode 202 is fabricated from the same material as the first electrodes 18a, 18b, 18c, 18d, 18e, 18f, 18g, 18h and 18i as well as electrode 18 in FIGS. 1A and 1B.

The second electrodes (20a, 20b, 20c, 20d, 20e, 20f, 20g, 20h and 20i) of LEDs 10a, 10b, 10c, 10d, 10e, 10f, 10g, 10h and 10i in the two-dimensional array 200 are electrically connected via electrodes 204 and conducting wire 210. Electrodes 204 are fabricated from any electrically conducting metal. The connections may be made, for example, by wire bonding. Suitable metals were previously listed for electrodes 18 and 20 of LED 10 in FIGS. 1A and 1B.

A current source 206 is attached to the two-dimensional array 200 via electrically conducting wires 208 and 210. When the proper current is applied to the two-dimensional array 200 by current source 206, all nine LEDs (10a, 10b, 10c, 10d, 10e, 10f, 10g, 10h and 10i) will emit light. Illustrative light rays 220, 222 and 224 indicate light emission from LEDs 10d, 10e and 10f, respectively in FIG. 6B.

Figure 7A:
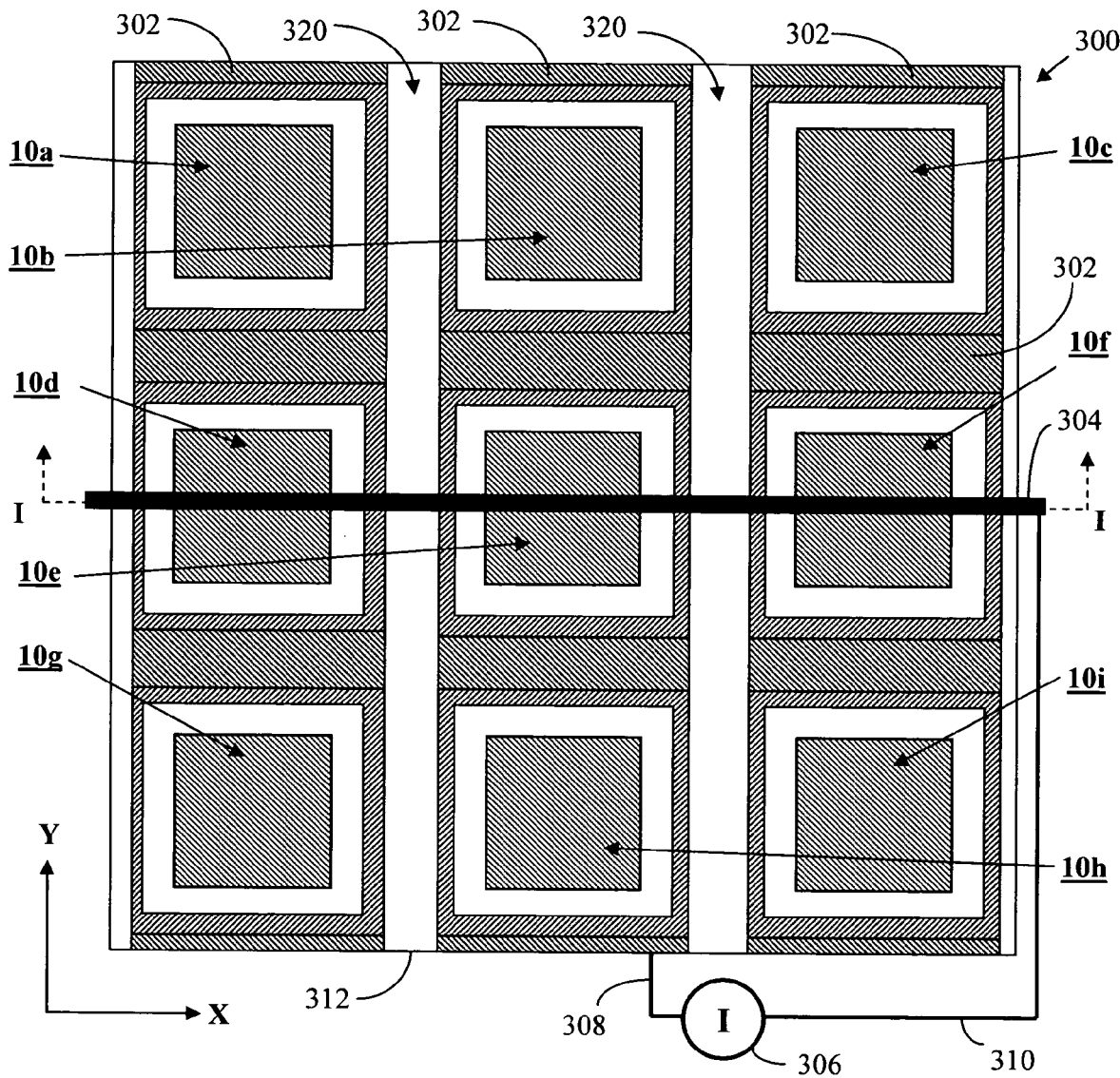
FIG. 7A-7B illustrate another embodiment of this invention that is a two-dimensional array of nine light emitting diodes.
Figure 7B:
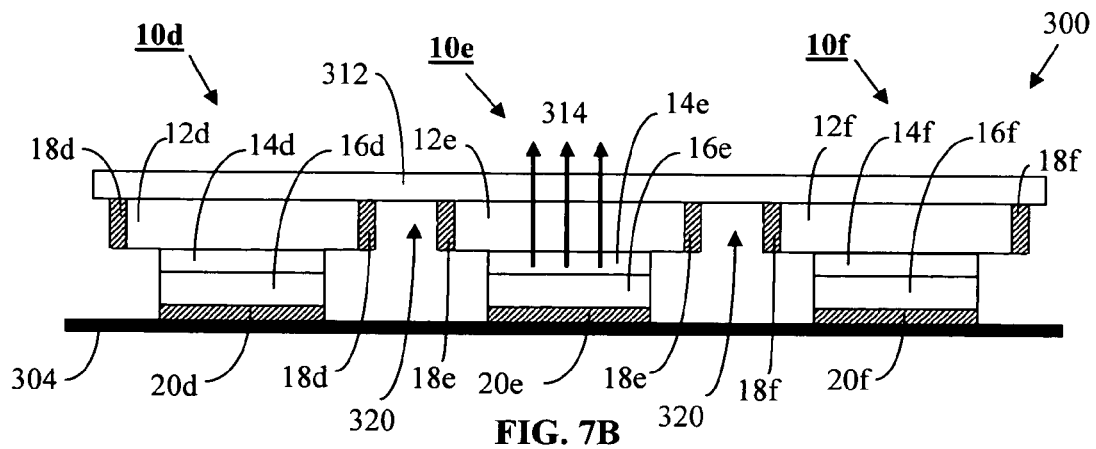

FIG. 7A illustrates a bottom plane view of another embodiment of this invention that includes a plurality of LEDs. FIG. 7B illustrates a cross-sectional view of this embodiment along the I-I plane indicated in FIG. 7A. In this example, the plurality of LEDs is a two-dimensional array 300 of nine LEDs. The LEDs are labeled 10a, 10b, 10c, 10d, 10e, 10f, 10g, 10h and 10i. The three LEDs shown in the cross-sectional view in FIG. 7B are 10d, 10e and 10f. The two-dimension array 300 of nine LEDs is an example for illustrative purposes. The two-dimensional array may contain four LEDs or more than four LEDs. The two-dimensional array may be a square-shaped array, a rectangular-shaped array or any other shape that contains at least two LEDs in each dimension. LEDs 10a, 10b, 10c, 10d, 10e, 10f, 10g, 10h and 10i in FIGS. 7A and 7B are structurally and functionally identical to LED 10 in FIGS. 1A and 1B. Each LED in FIGS. 7A and 7B has a first semiconductor layer (12a, 12b, 12c, 12d, 12e, 12f, 12g, 12h or 12i), an active region (14a, 14b, 14c, 14d, 14e, 14f, 14g, 14h or 14i), a second semiconductor layer (16a, 16b, 16c, 16d, 16e, 16f, 16g, 16h or 16i), a first electrode (18a, 18b, 18c, 18d, 18e, 18f, 18g, 18h or 18i) and a second electrode (20a, 20b, 20c, 20d, 20e, 20f, 20g, 20h or 20i). The second electrodes are multilayer structures.

The first electrodes of the LEDs in the two-dimensional array 300 are connected in columns by electrodes 302. The portions of electrodes 302 in the areas 320 between the columns have been removed to electrically isolate the columns.

Since the electrode material has been removed in areas 320, a substrate 312 must be present to provide structural support for the two-dimensional array 300. The substrate 312 may be the original growth substrate used to fabricate the semiconductor layers of the LEDs. The first electrodes 18a, 18d and 18g are connected together in a first column; the first electrodes 18b, 18e and 18h are connected together in second column; and the first electrodes 18c, 18f and 18i are connected together in a third column. Electrodes 302 are fabricated from the same material as the first electrodes 18a, 18b, 18c, 18d, 18e, 18f, 18g, 18h and 18i as well as electrode 18 in FIGS. 1A and 11B.

The second electrodes of the LEDs in the two-dimensional array 300 are connected in rows by electrodes 304. For simplicity, only one electrode 304 is shown in the figures. For example, electrodes 20d, 20e and 20f are connected in a row by electrode 304 in FIG. 7A. Electrodes 20a, 20b and 20c and electrodes 20g, 20h and 20i are similarly connected in rows by electrodes 304 (but not shown in FIG. 7A). Electrodes 304 are fabricated from any electrically conducting metal. The connections may be made, for example, by wire bonding. Suitable metals were previously listed for electrodes 18 and 20 of LED 10 in FIGS. 1A and 1B.

A current source 306 is attached to the two-dimensional array 300 via electrically conducting wires 308 and 310. When the proper current is applied to the two-dimensional array 300 by current source 206, a single LED (10e) will emit light 314. By properly choosing electrodes of the appropriate row and column of the two-dimensional array 300, any LED in the array may be individually powered to emit light. By time and spatial sequencing of the light emission from the individual LEDs in the array, the array can be used in imaging applications such as two-dimensional displays. Each LED in the array is a pixel (picture element) of the display.

Another embodiment of this invention is a method for fabricating at least one light emitting diode. The process includes several steps.

Figure 8:
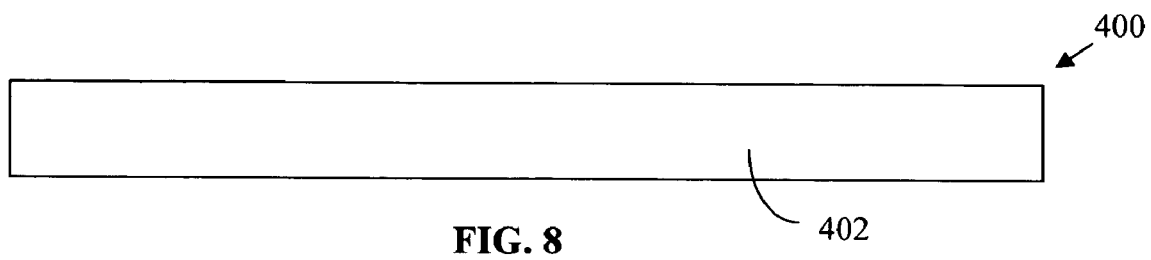
FIG. 8 illustrates a cross-sectional view of a growth substrate of an embodiment of the present invention.

The first step of the method for fabricating at least one light emitting diode is to provide a growth substrate onto which subsequent semiconductor layers are deposited. FIG. 8 illustrates a cross-sectional view of assembly 400 that consist of growth substrate 402. The growth substrate 402 has a crystal structure that allows for epitaxial growth of the semiconductor layers. The grow substrate is also optically transparent to the light required in any subsequent laser-assisted processing steps. Example growth substrates for GaN-based LED devices are sapphire ($Al_2O_3$) and silicon carbide (SiC). The preferred substrate for GaN-based LEDs is sapphire.

Figure 9:
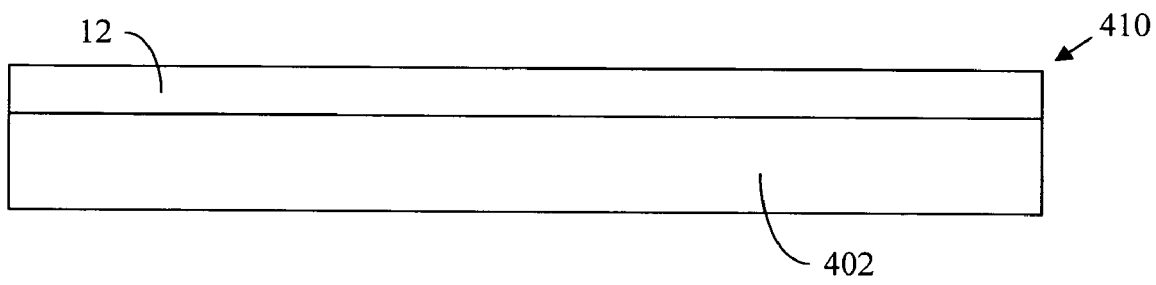
FIG. 9 illustrates a cross-section view of an assembly shown in FIG. 8 that includes a first doped semiconductor layer.

Another step of the method for fabricating at least one light emitting diode is to deposit a first doped semiconductor layer 12 onto the growth substrate 402. FIG. 9 illustrates a cross-section view of assembly 410, which includes the growth substrate 402 and the first doped semiconductor layer 12. Example semiconductor materials for the first doped semiconductor layer 12 have been listed previously.

The first doped semiconductor layer 12 is also a current spreading layer. In order to increase the current spreading capability of the first doped semiconductor layer 12, preferably the first doped semiconductor layer is greater than 2 microns thick. More preferably, the thickness of the first doped semiconductor layer is greater than 5 microns thick. Most preferably, the thickness of the first doped semiconductor layer is greater than 10 microns thick. If the LED is a GaN-based device, preferably the first doped semiconductor layer 12 is an n-doped GaN layer.

Semiconductor layers such as the first doped semiconductor layer 12 can be deposited onto a growth substrate using a variety of deposition methods. Deposition methods can include, for example, chemical vapor deposition (CVD), metal-organic chemical vapor deposition (MOCVD), molecular beam epitaxy MBE), liquid phase epitaxy (LPE), vapor phase epitaxy (VPE), and hydride vapor phase epitaxy (HVPE), but are not limited to these methods. When a layer of semiconductor material is deposited onto a growth substrate, tensile or compressive stresses can occur that affect the planarity of the deposited film as well as the electrical and optical properties of the semiconductor layer. For example, HVPE exhibits very high deposition rates and reasonable crystal quality for GaN growth on growth substrates such as sapphire. Attempts to grow GaN layers thicker than 20 microns, however, can result in cracking, especially for doped layers. For GaN-based LEDs, preferably the first doped semiconductor layer 12 is an n-doped GaN layer that is grown by HVPE.

Figure 10:
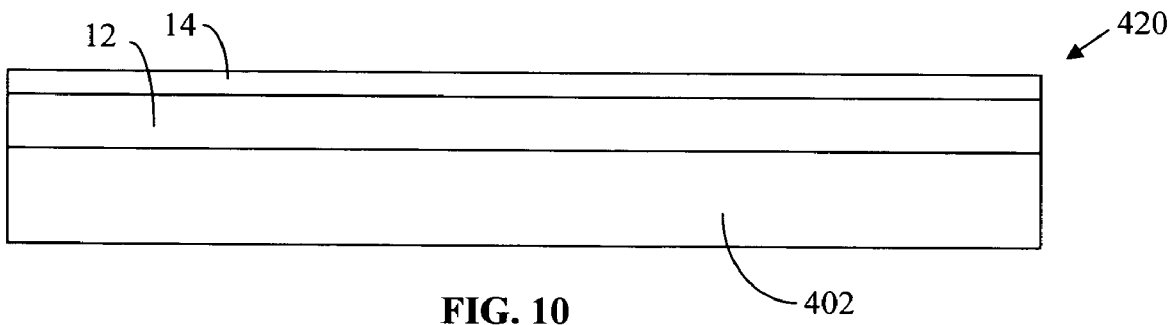
FIG. 10 illustrates a cross-section view of an assembly shown in FIG. 9 that further includes an active region.

Another step of the method for fabricating at least one light emitting diode is to deposit an active region 14 onto the first doped semiconductor layer 12. FIG. 10 illustrates a cross-section view of assembly 420, which includes the growth substrate 402, the first doped semiconductor layer 12 and the active region 14. The active region is deposited using one of the deposition methods listed above.

Figure 11A:
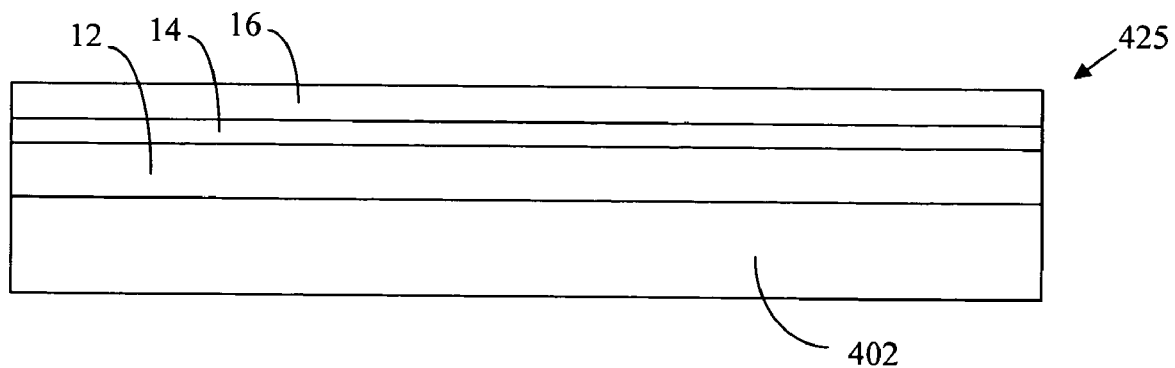
FIG. 11A illustrates a cross-section view of an assembly shown in FIG. 10 that further includes a second doped semiconductor layer.

Another step of the method for fabricating at least one light emitting diode is to deposit a second doped semiconductor layer 16 onto the active region 14. FIG. 11A illustrates a cross-section view of assembly 425, which includes the growth substrate 402, the first doped semiconductor layer 12, the active region 14 and the second doped semiconductor layer 16. The second doped semiconductor layer 16 is deposited using one of the deposition methods listed above.

Figure 11B:
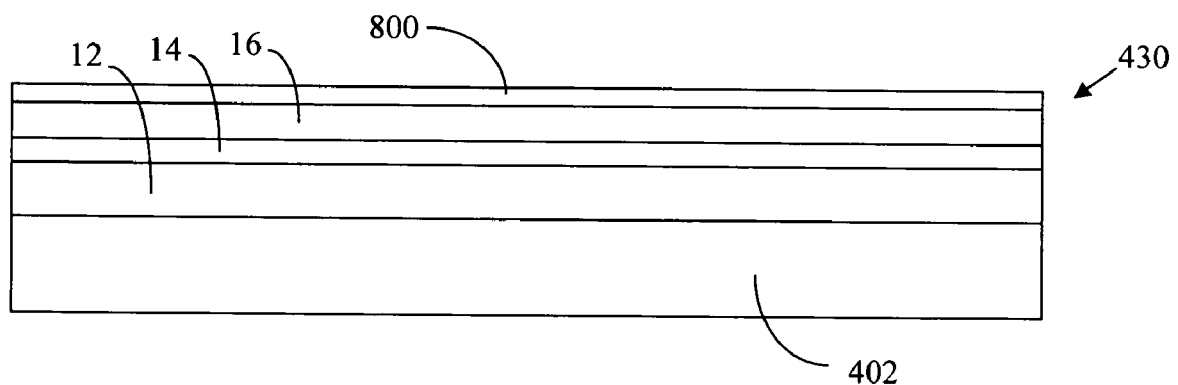
FIG. 11B illustrates a cross-sectional view of an assembly shown in FIG. 11A that further includes a transparent layer.

Another step of the method for fabricating at least one light emitting diode is to deposit a transparent layer 800 onto the second doped semiconductor layer 16. FIG. 11B illustrates a cross-section view of assembly 430, which includes the growth substrate 402, the first doped semiconductor layer 12, the active region 14, the second doped semiconductor layer 16 and transparent layer 800. The transparent layer 800 is deposited using one of the deposition methods listed above.

Figure 11C:
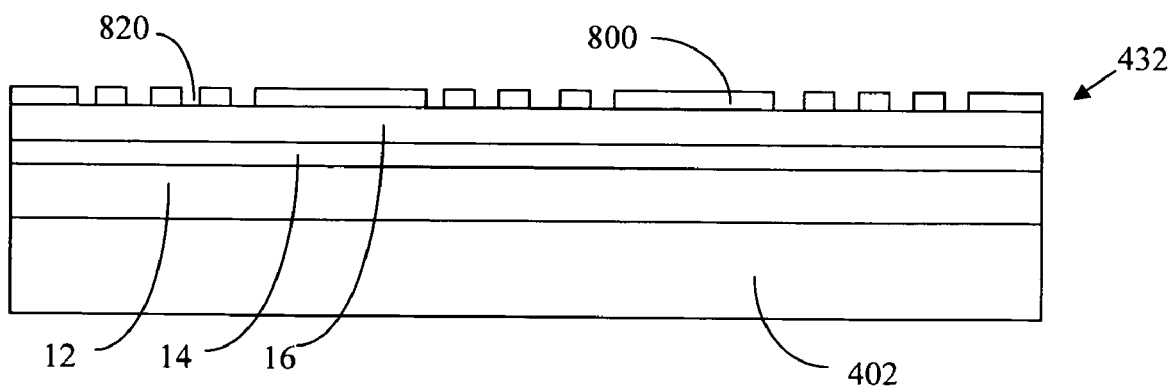
FIG. 11C illustrates a cross-sectional view of an assembly shown in FIG. 11B that includes optional vias extending through the transparent layer.

An optional step of the method for fabricating at least one light emitting diode is to etch vias 820 through the transparent layer 800 to the second doped semiconductor layer 16. FIG. 11C illustrates a cross-section view of assembly 432, which includes the growth substrate 402, the first doped semiconductor layer 12, the active region 14, the second doped semiconductor layer 16 and a transparent layer 800 that includes vias 820. Vias 820 may be etched by laser ablation, laser etching, or any standard wet or dry semiconductor etching process. The vias 820 are needed if the transparent layer 800 is an electrically insulating layer. The vias will later be filled with a metal to form metal contacts (not shown).

In order to simplify FIGS. 12-23, the vias and the metal contacts will be not be shown. Only the reflective conductive metallic layer 804 (if present) and the transparent layer 800 of electrode 20 will be shown. However, in FIGS. 12-23, second electrode 20 can be, for example, one of the following: (1) an electrically conducting transparent layer in contact with the second doped semiconductor layer and a reflective metallic layer in contact with the transparent layer; (2) an insulating transparent layer in contact with the second doped semiconductor layer, a reflective metallic layer in contact with the transparent layer and an array of metal contacts extending through the transparent layer; or (3) a transparent current spreading layer in contact with the second doped semiconductor layer, an insulating transparent layer in contact with the transparent current spreading layer, a reflective metallic layer in contact with the transparent layer and an array of metal contacts extending through the transparent layer.

Figure 12A:
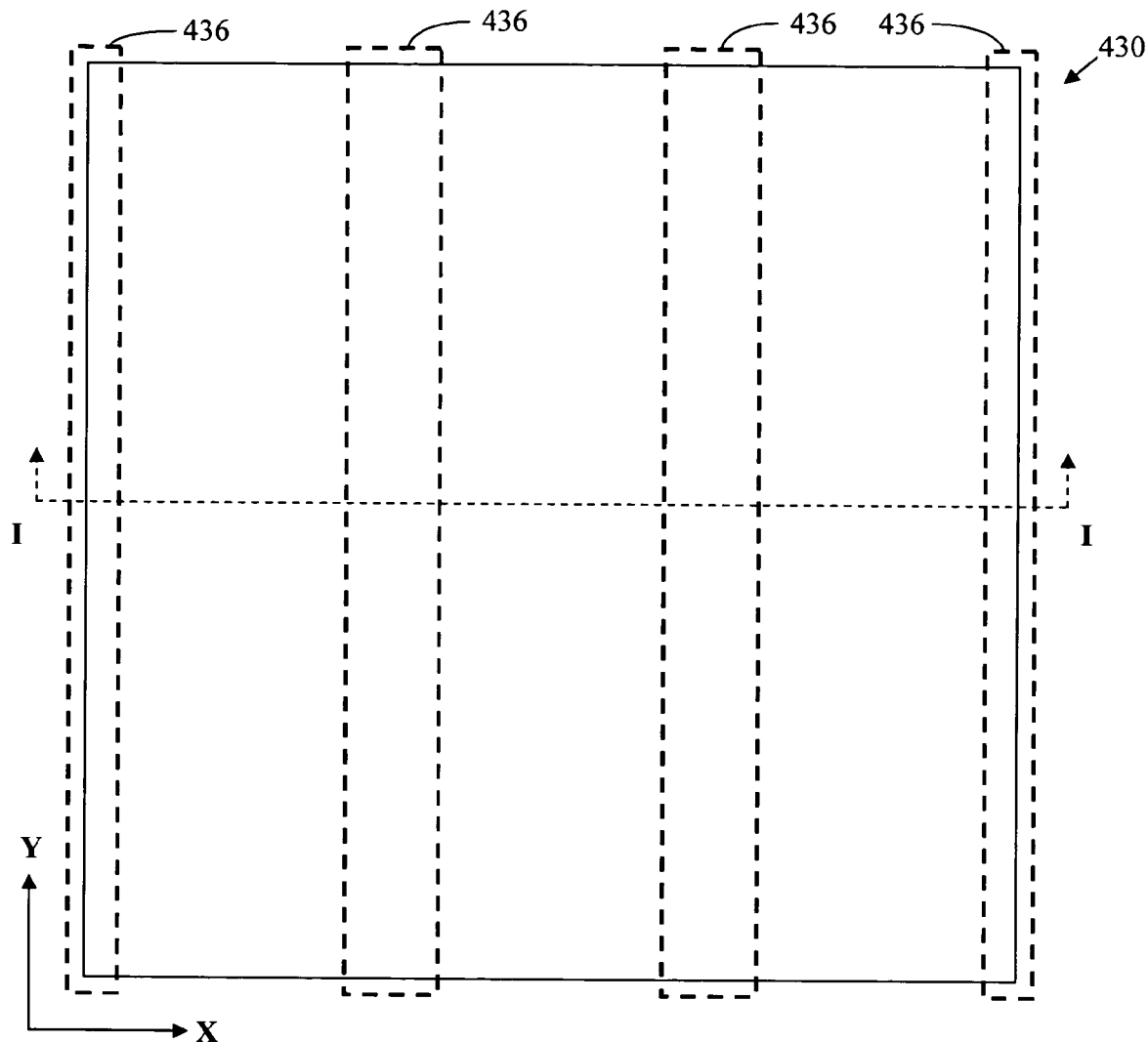
FIGS. 12A-12B illustrate an embodiment of this invention.
Figure 12B:
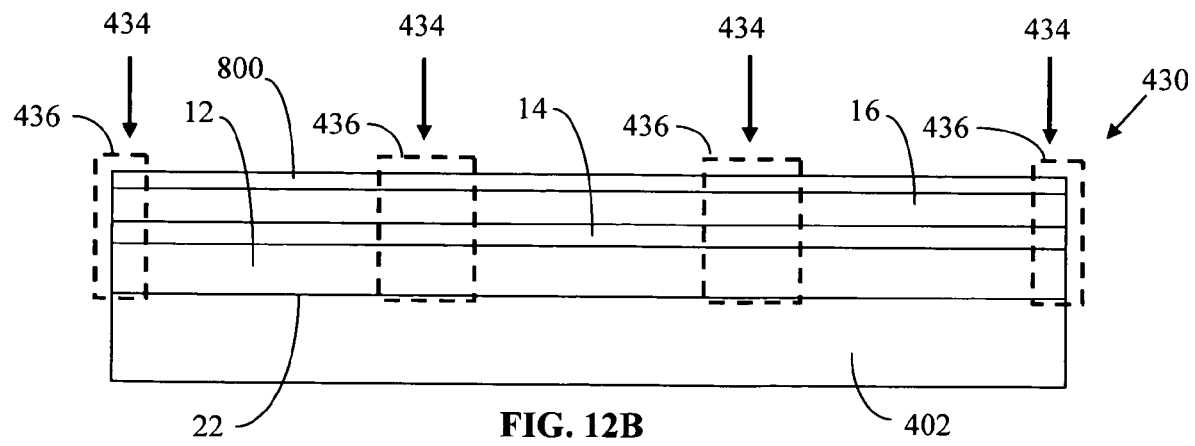

Assembly 430 is illustrated again in FIG. 12A and FIG. 12B. FIG. 12A is a top plane view of assembly 430 and FIG. 12B is a cross-sectional view of assembly 430 along the I-I plane shown in FIG. 12A.

Another step of the method for fabricating at least one light emitting diode is to etch a first array of parallel trenches through the transparent layer 800, the second semiconductor layer 16, the active region 14 and the first semiconductor layer 12. The areas that are removed by the etching process are enclosed inside the dashed lines 436 in FIGS. 12A and 12B.

Figure 13A:
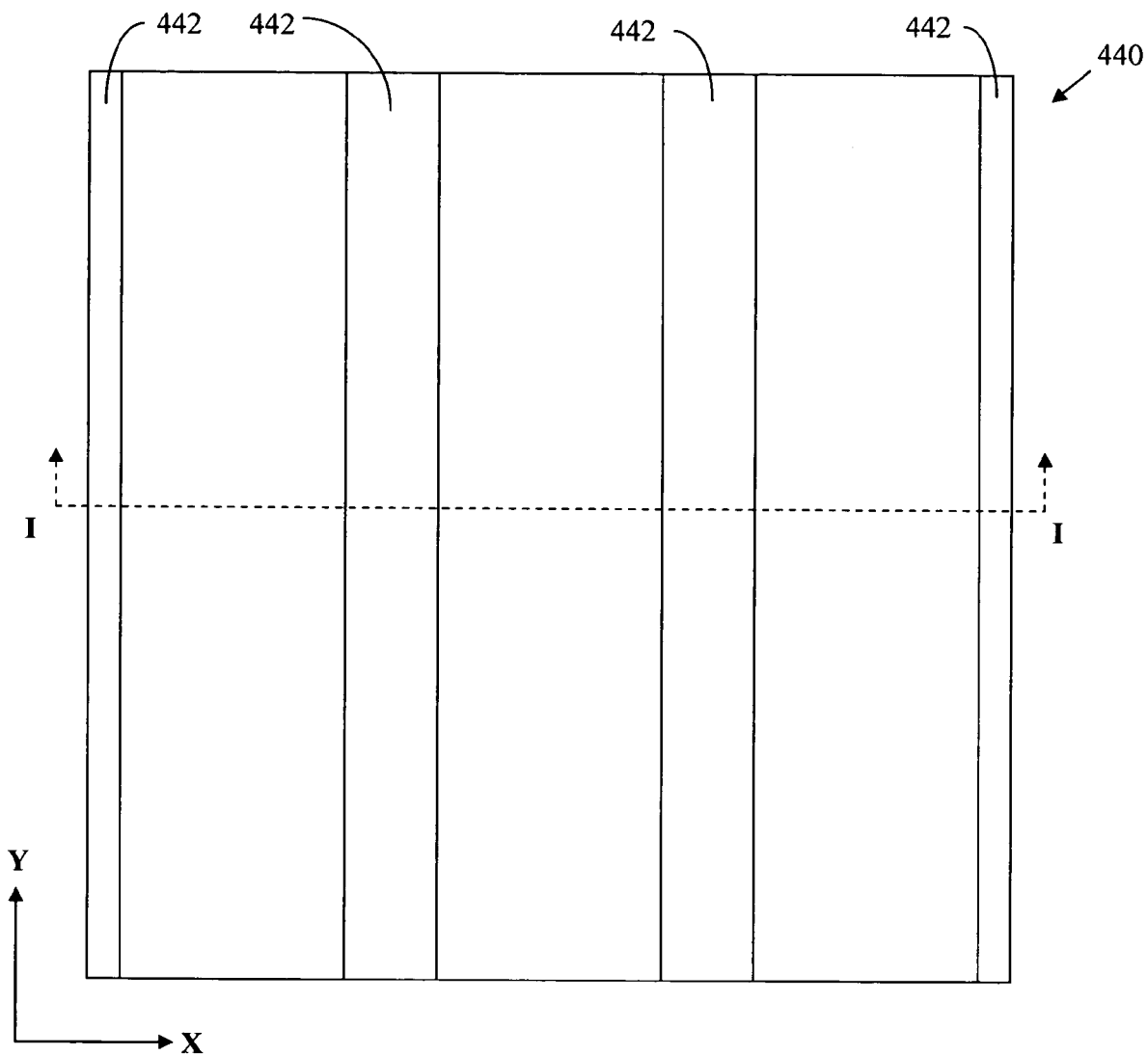
FIG. 13A-13B illustrate an embodiment of this invention that includes a first array of trenches.
Figure 13B:
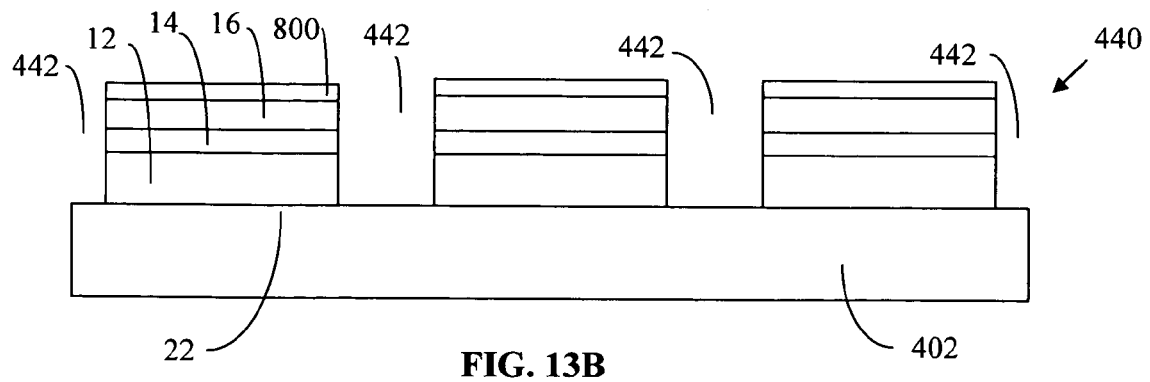

The resulting first array of parallel trenches 442 is illustrated in assembly 440 in FIGS. 13A and 13B. FIG. 13A is a top plane view of assembly 440. FIG. 13B is a cross-sectional view along the I-I plane shown in FIG. 13A. The first array of parallel trenches 442 is parallel to the y-axis. The etching process is stopped at the first surface 22 of the first doped semiconductor layer 12. The trenches 442 are shown with vertical sidewalls. However, trenches 442 may also have angled sidewalls or curved sidewalls if desired. Whether the sidewalls are vertical, angled or curved depends on the details of the etching process. In FIGS. 13A and 13B, the first array of trenches divides the semiconductor layers into three columns of semiconductor material. Three columns were chosen for illustrative purposes only. The number of columns may also be less than three or more than three.

The etching process can be a dry etching process or a wet etching process. Dry etching processes include reactive ion etching, plasma etching and laser etching. The preferred etching process is a laser etching process using laser light 434. Laser etching generally has a higher etch rate than other etching processes. Laser etching is done by laser ablation using a pulsed laser. Example lasers for laser etching include, but are not limited to, diode-pumped solid-state lasers and excimer lasers. Examples of diode-pumped solid-state lasers are frequency-tripled or frequency-quadrupled yttrium-aluminum-garnet (YAG) lasers operating at 355 nm or at 266 μm, respectively. Examples of excimer lasers are argon-fluoride excimer lasers that emit light at 193 nm or krypton fluoride excimer lasers that emit light at 248 nm.

In order to prevent leakage currents along the sides of the trenches after the laser etching process, it may be necessary to utilize a subsequent second etching process to clean the surface. The second etching process may be, for example, reactive ion etching, plasma etching or another laser etching process.

Figure 14A:
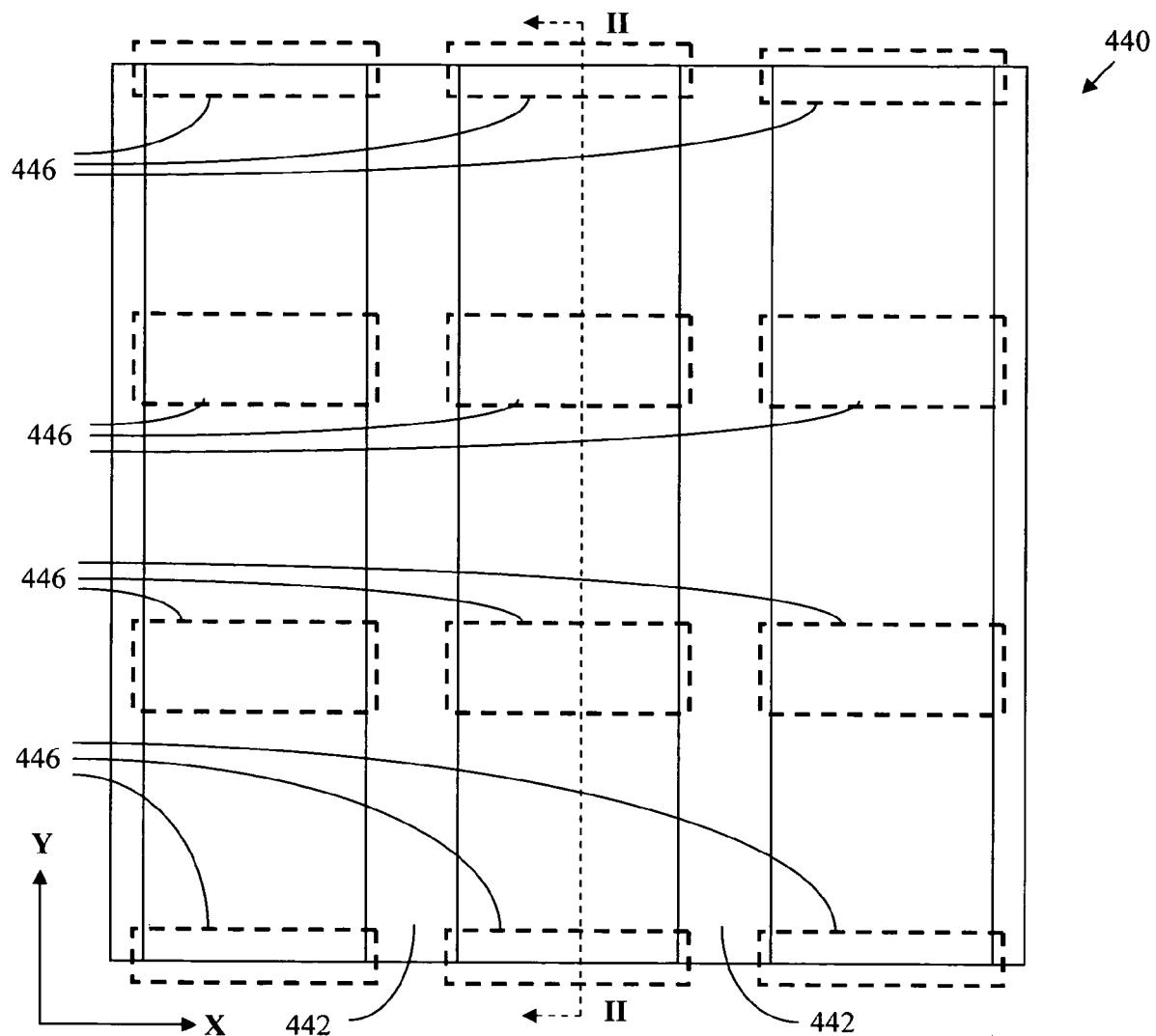
FIG. 14A-14B illustrate an embodiment of this invention.
Figure 14B:
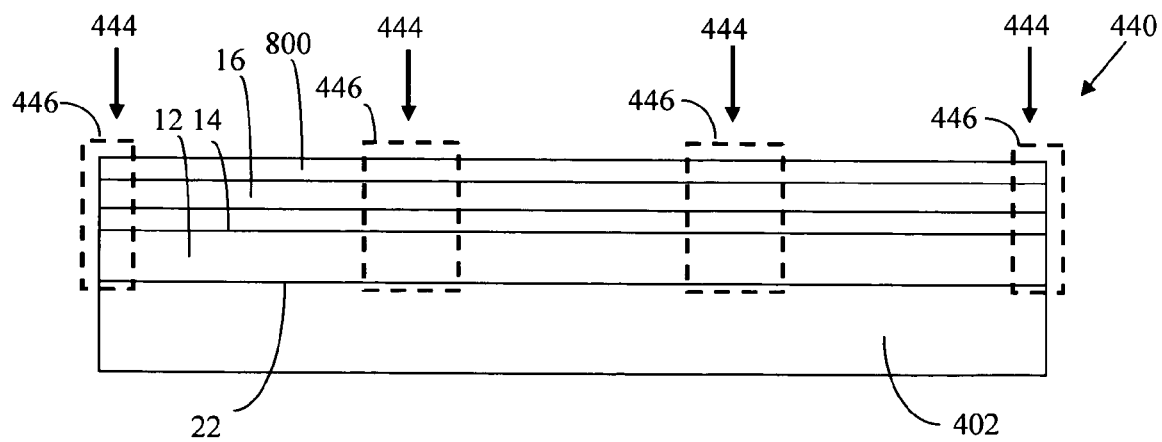

Assembly 440 is illustrated again in FIG. 14A and FIG. 14B. FIG. 14A is a plane view of assembly 440 and FIG. 14B is a cross-sectional view of assembly 440 along the II-II plane shown in FIG. 14A.

Another step of the method for fabricating at least one light emitting diode is to etch a second array of parallel trenches through transparent layer, the second semiconductor layer 16, the active region 14 and the first semiconductor layer 12. The areas that are removed by the etching process are enclosed inside the dashed lines 446 in FIGS. 14A and 14B.

Figure 15A:
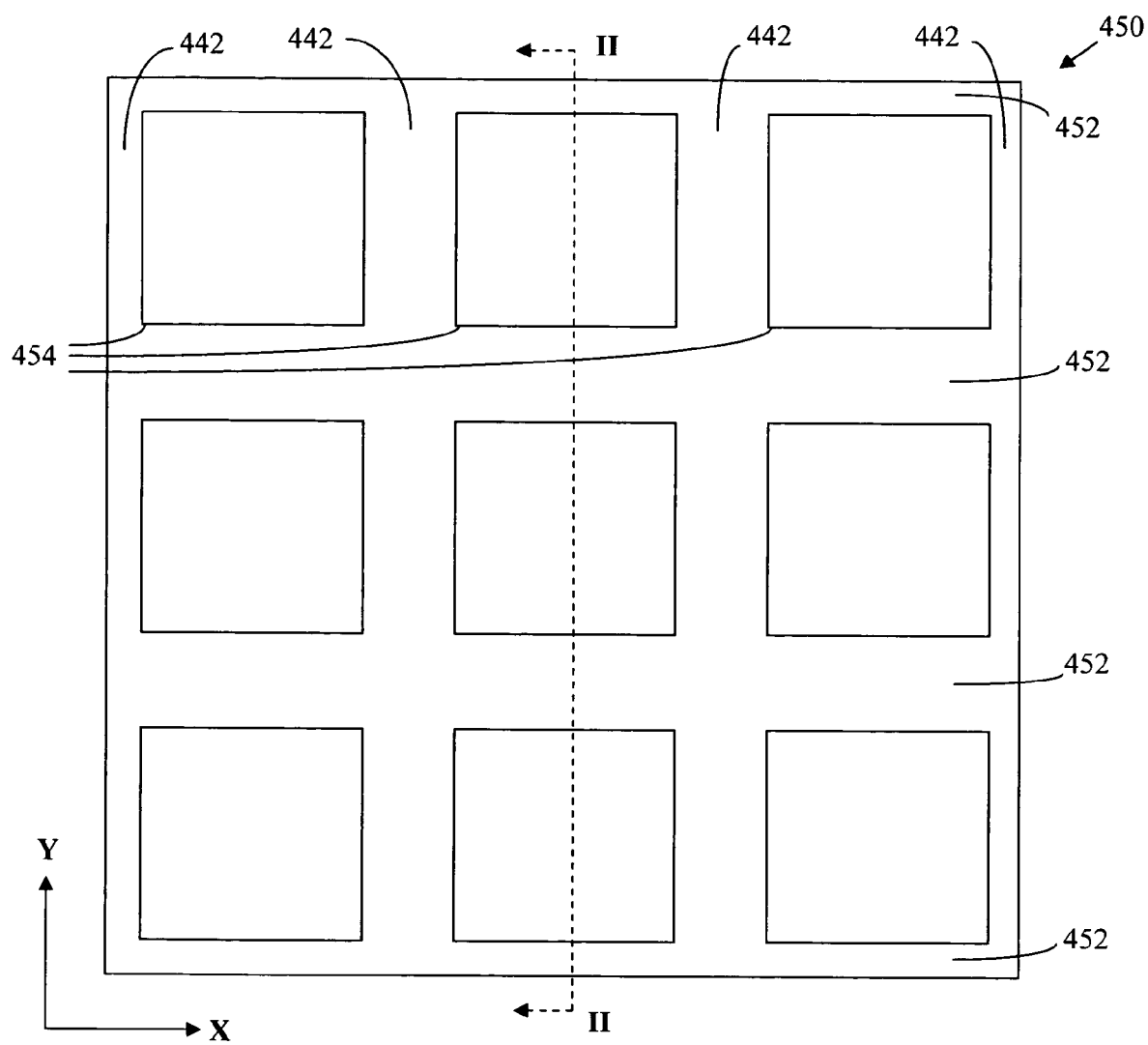
FIG. 15A-15B illustrate an embodiment of this invention.
Figure 15B:
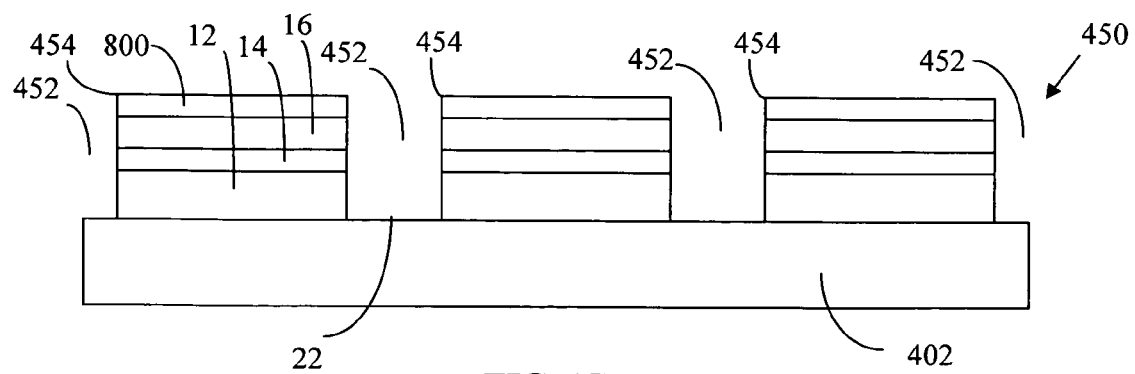

The resulting second array of parallel trenches 452 is illustrated in assembly 450 in FIGS. 15A and 15B. FIG. 15A is a top plane view of assembly 450. FIG. 15B is a cross-sectional view along the II-II plane shown in FIG. 15A. The second array of parallel trenches 452 is parallel to the x-axis and substantially perpendicular to the first array of parallel trenches 442. The first array of parallel trenches 442 and the second array of parallel trenches 452 form isolated dies 454 attached to the growth substrate 402. The etching process for the second array of parallel trenches is stopped at the first surface 22 of the first doped semiconductor layer 12. Example etching processes are listed above. The preferred etching process is a laser etching process using laser light 444. Laser etching is done by laser ablation using a pulsed laser. Trenches 452 are illustrated with vertical sidewalls. However, trenches 452 may also have angled or curved sidewalls if desired. In FIGS. 15A and 15B, the second array of trenches divides the semiconductor layers into three rows of semiconductor dies. Three rows were chosen for illustrative purposes only. The number of rows may also be less than three or more than three.

Figure 16A:
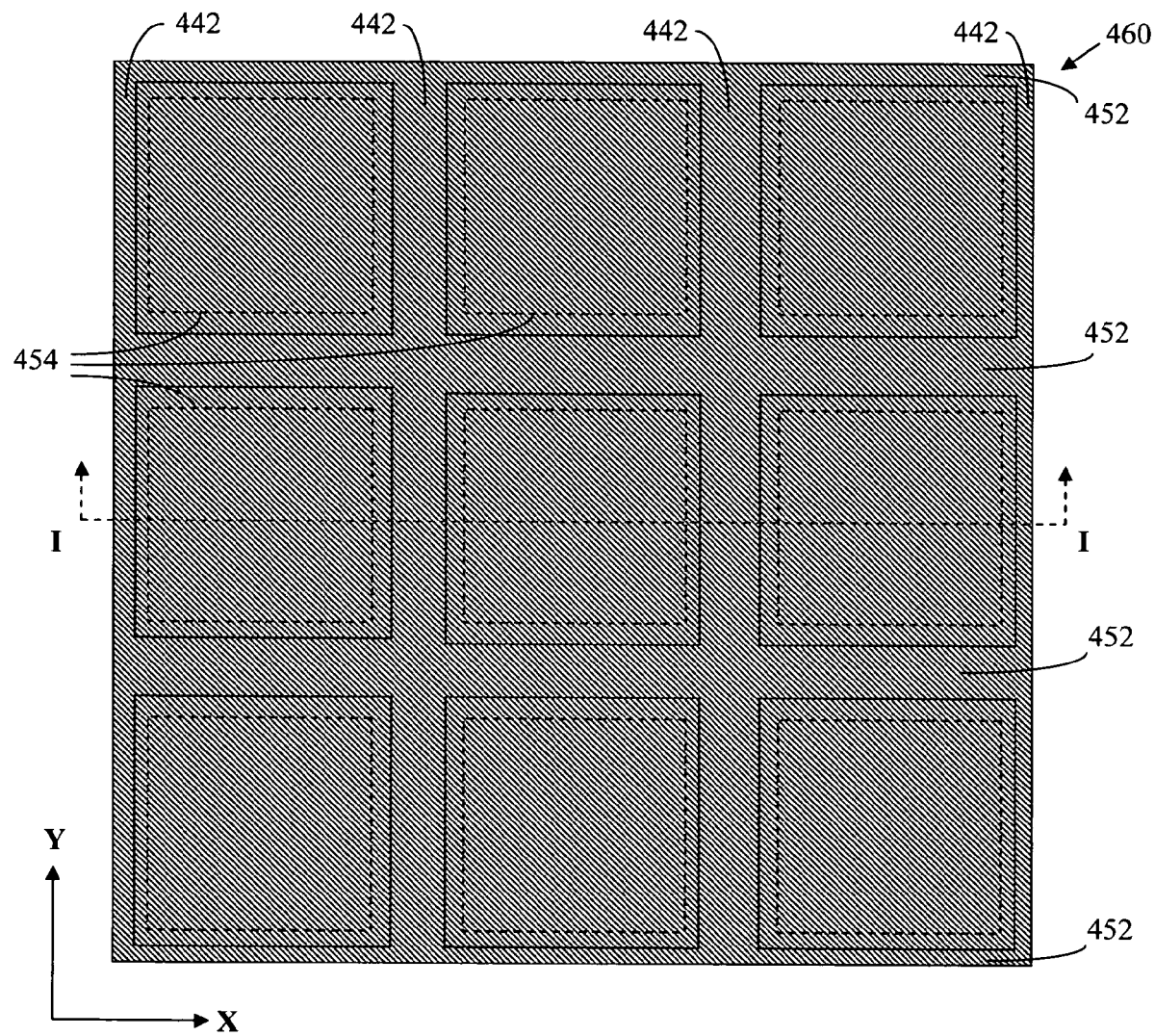
FIG. 16A-16B illustrate an embodiment of this invention.
Figure 16B:
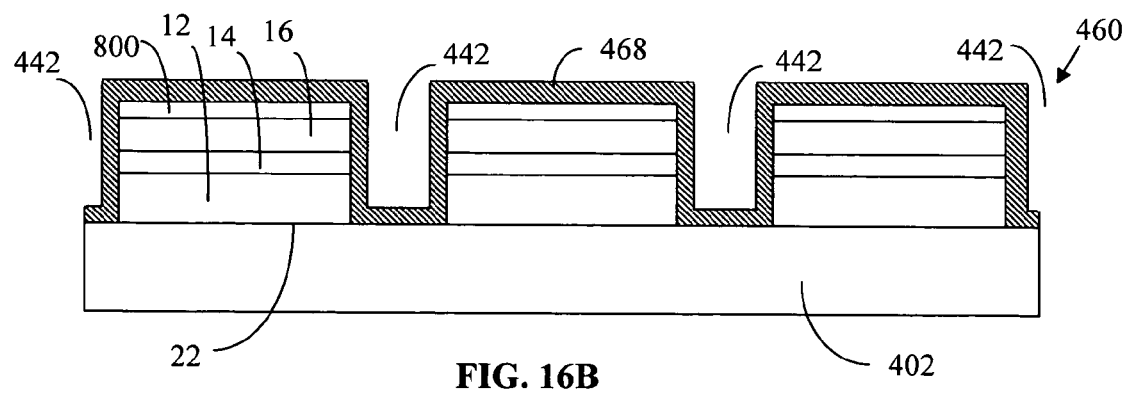

Another step in the method for fabricating at least one light emitting diode is to deposit a metal layer 468 over the exposed surfaces of the transparent layer 800, exposed surfaces of the second doped semiconductor layer 16, the exposed surfaces of the first array of parallel trenches 442 and the exposed surfaces of the second array of parallel trenches 452. The exposed surfaces of the first array of parallel trenches 442 and the exposed surfaces of the second array of parallel trenches 452 include the edges of the transparent layer 800, the edges of the second doped semiconductor layer 16, the edges of the active region, the edges of the first doped semiconductor layer and the exposed surfaces of the growth substrate 402. The resulting assembly 460 is shown in FIGS. 16A and 16B. FIG. 16A is a top plane view of assembly 460 and FIG. 16B is a cross-sectional view along the I-I plane shown in FIG. 16A. Appropriate materials for the metal layer may include one or more electrically conducting metals or metal alloys containing, but not limited to, silver, aluminum, nickel, gold, titanium, chromium, platinum, palladium, rhodium, rhenium, ruthenium and tungsten. Preferred metals are aluminum and silver.

Figure 17A:
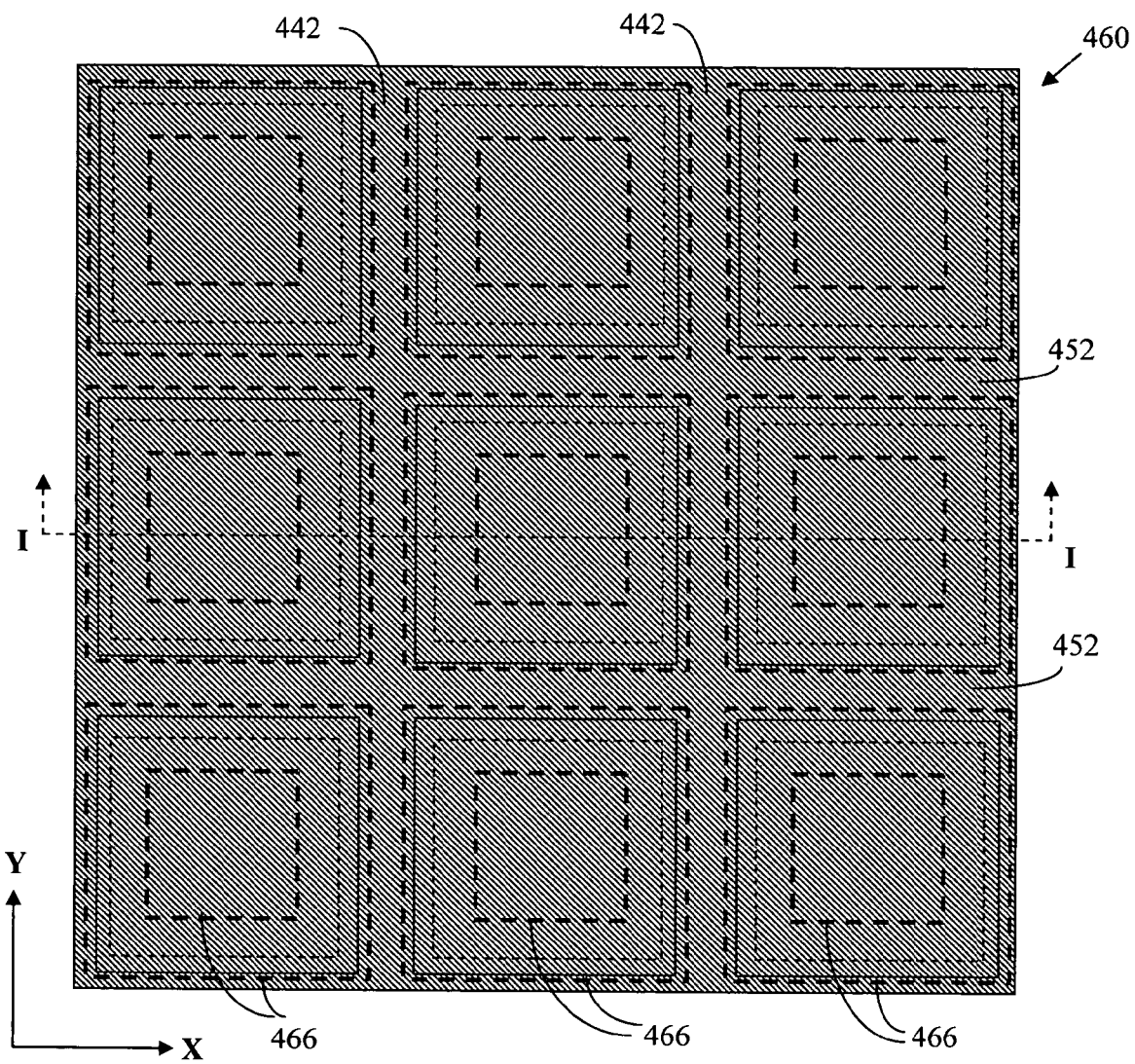
FIGS. 17A-17B illustrate an embodiment of this invention.
Figure 17B:
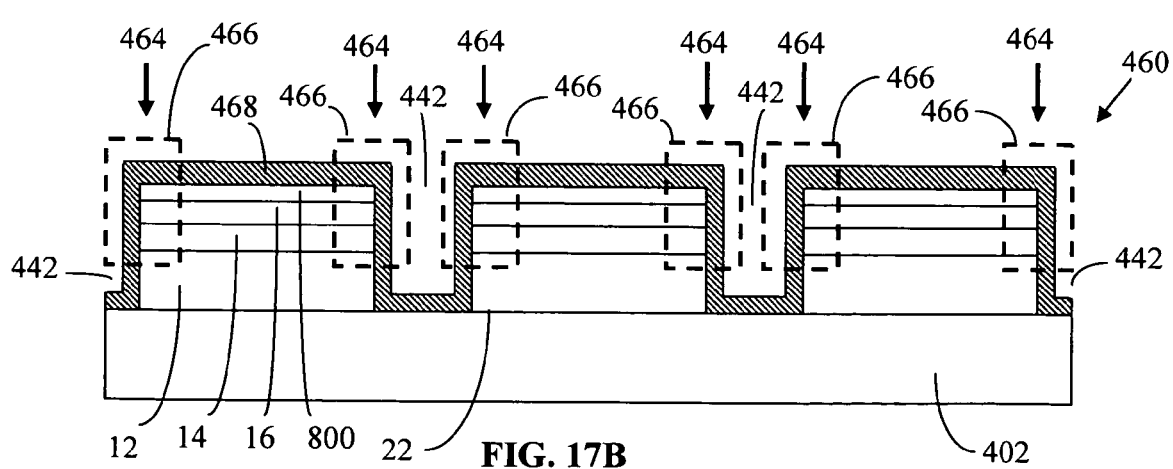

Assembly 460 is illustrated again in FIGS. 17A and 17B. FIG. 17A is a top plane view of assembly 460. FIG. 17B is a cross-sectional view along the I-I plane shown in FIG. 17A.

Another step in the method for fabricating at least one light emitting diode is to remove, via a laser etching process directed along the edges of the isolated dies, the metal layer 468 covering the transparent layer 800, the second doped semiconductor layer, the second doped semiconductor layer, the metal layer covering the edges of the active region and the active region. The areas that are removed by the laser etching process are enclosed inside the dashed lines 466 in FIG. 17B. The areas that are removed in FIG. 17A are the areas between concentric pairs of dashed lines 466.

Figure 18A:
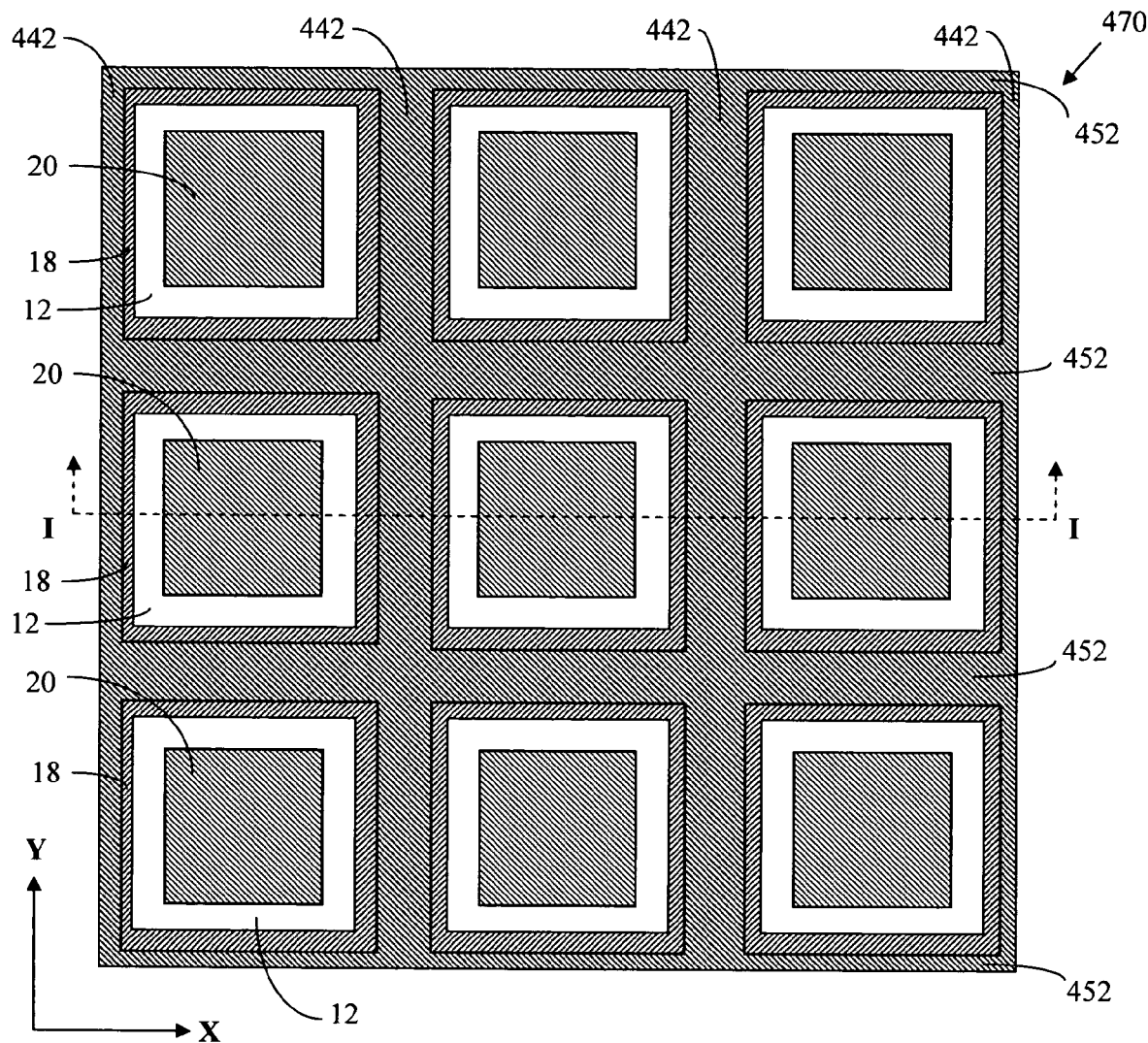
FIGS. 18A-18B illustrate an embodiment of this invention.
Figure 18B:
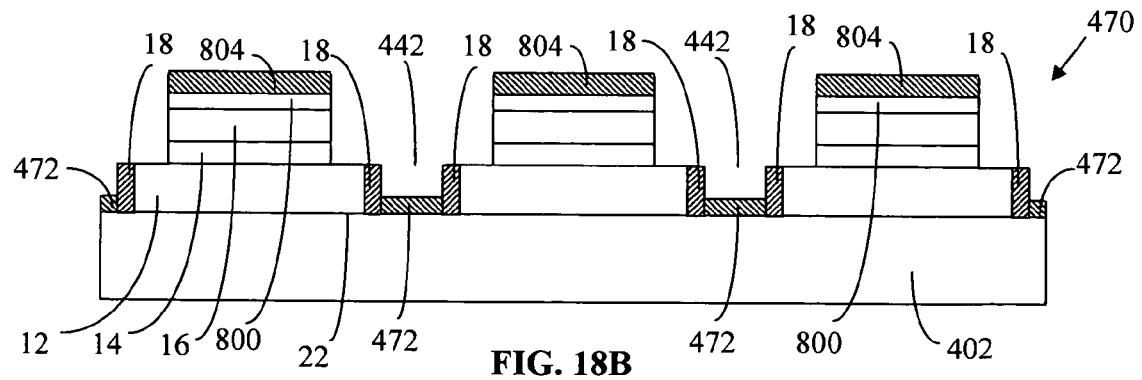

The resulting etched structure is illustrated as assembly 470 in FIGS. 18A and 18B. FIG. 18A is a top plane view of assembly 470. FIG. 18B is a cross-sectional view along the I-I plane shown in FIG. 18A. The metal layers on the edges of the first semiconductor layers of the isolated dies form first electrodes 18. The transparent layers 800 and the reflective conductive metallic layers 804 form the second electrodes 20 of the isolated dies. The first electrodes 18 of the isolated dies are electrically connected via remaining portions 472 of the metal layer. The reflective conductive metallic layers 804 of the isolated dies are electrically isolated.

Assembly 470 as illustrated in FIGS. 18A and 18B now consists of a two-dimensional array of isolated LED dies that have first electrodes 18 and second electrodes 20. The second electrodes 20 each consists of a transparent layer 800 and a reflective conductive metallic layer 804. The first electrodes 18 of all the dies are electrically connected. The dies are all still attached to the growth substrate 402. At this point, there are several options available. In the first option, the dies can be removed from the growth substrate as a single two-dimensional array of LED dies having the first electrodes of all the dies electrically connected. As a second option, the two-dimensional array of dies can be divided into linear (one-dimensional) arrays of dies. The dies can be separated into columns of linear arrays of dies. The columns of linear arrays of dies can be left attached to the growth substrate or the columns of linear arrays of dies can be removed from the growth substrate. As a third option, the two-dimensional array of dies can be divided into single dies. The single dies can be removed from the growth substrate if desired. The semiconductor layers of the single dies are thick enough so that the LEDs can be handled and used without the growth substrate or a transfer substrate. Eliminating the growth substrate and the transfer substrate from the LED dies can improve the thermal conductivity of the LEDs in practical applications where the LEDs are attached to a thermal heat sink. These options will be described in more detail below.

Figure 19A:
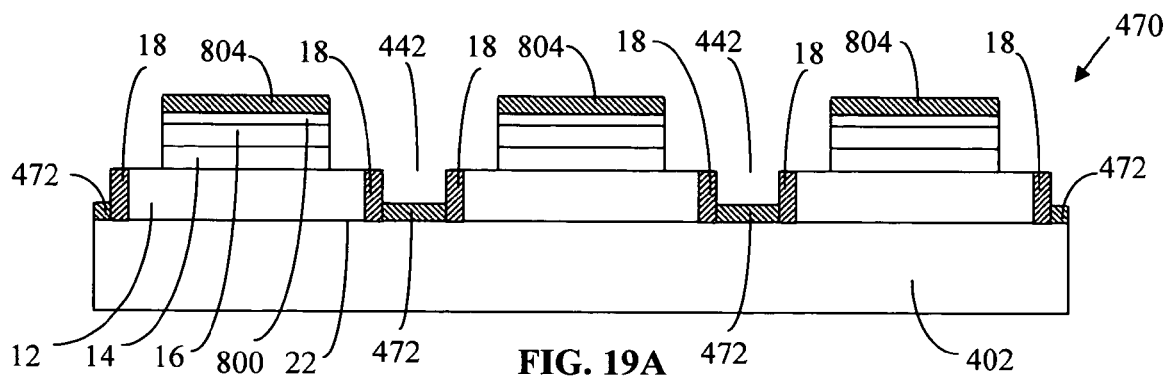
FIGS. 19A-19D illustrate cross-sectional views of another embodiment of this invention.
Figure 19B:
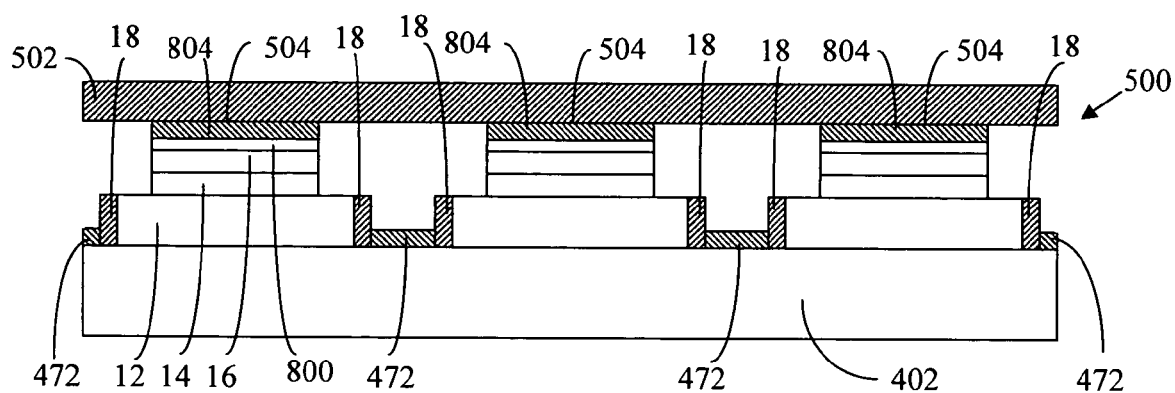

Starting with assembly 470, shown again in cross-section in FIG. 19A, another embodiment of this invention is a method for fabricating at least one light emitting diode. The first step of the method for fabricating at least one light emitting diode is to attach a transfer substrate 502 to the surfaces 504 of the second electrodes 20 as shown for assembly 500 in FIG. 19B. Attachment of the transfer substrate 502 may be accomplished by any means, including, but not limited to, a eutectic solder, an adhesive, or waxes. The transfer substrate may be an electrical conductor, an insulator or a semiconductor. If the transfer substrate is attached permanently to the reflective conductive metallic layer 804, preferably the transfer substrate 502 is an electrical conductor and the attachment is done with a eutectic solder.

Another step in the method for fabricating at least one light emitting diode is to remove the growth substrate 402 from assembly 500. Removal of the growth substrate 402 maybe accomplished via a laser liftoff process, chemical etching, or mechanical means. Preferably a laser liftoff process is used to remove the growth substrate. Lasers for the laser liftoff process include, but are not limited to, excimer lasers. Exemplary excimer lasers are argon-fluoride excimer lasers that emit light at 193 nm or krypton fluoride excimer lasers that emit light at 248 nm.

Figure 19C:
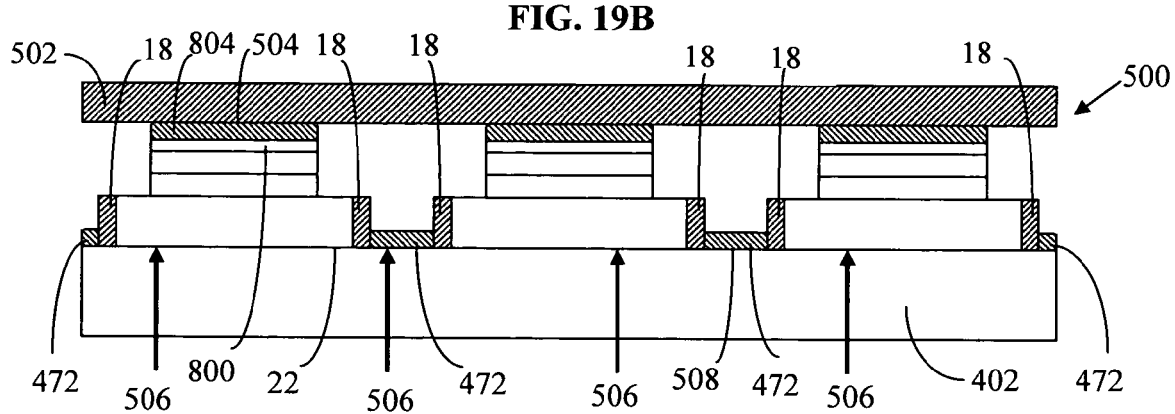
Figure 19D:
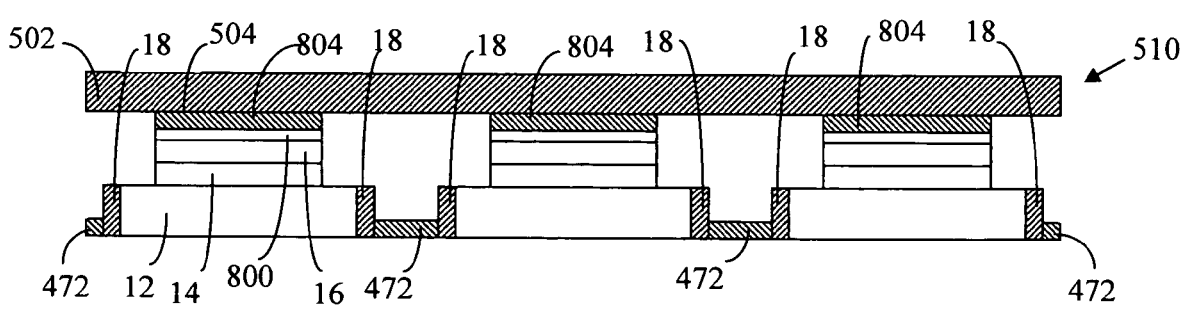

FIG. 19C illustrates laser light 506 passing through the transparent growth substrate 402 of assembly 500. The laser light 506 is incident at the first surfaces 22 of the first doped semiconductor layer 12 and surfaces 508 of the first electrodes 18 and metal layer 472. The laser light 506 causes the growth substrate 402 to detach from the first semiconductor layers 12, the first electrodes 18 and the metal layer 472.

When the growth substrate is removed from assembly 500, the resulting structure is assembly 510. Assembly 510 is illustrated in cross-section in FIG. 19D. Assembly 510 is a two-dimensional array of LED dies, where the first electrodes 18 of the dies are electrically connected.

Figure 20A:
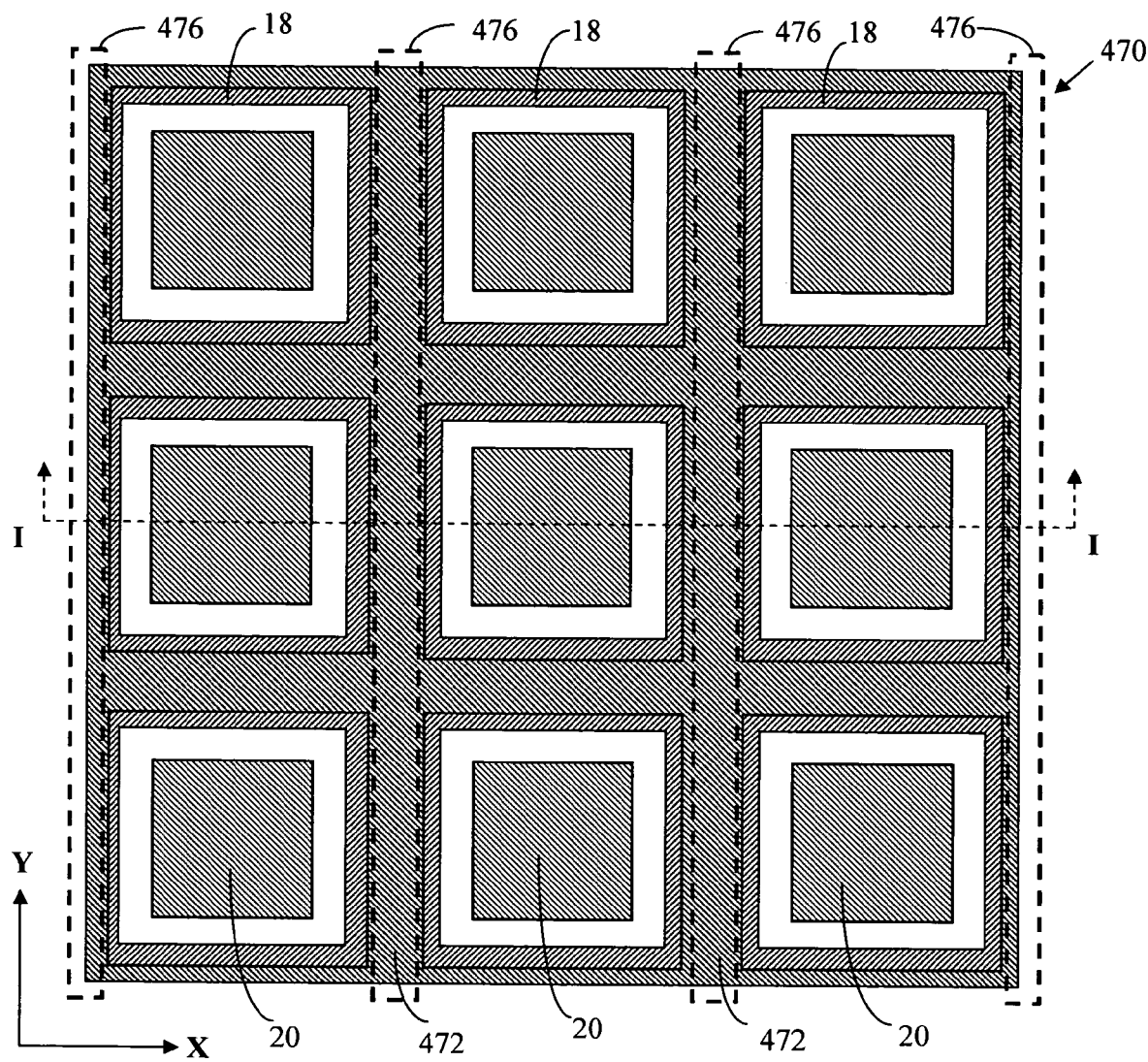
FIGS. 20A-20B again illustrates the assembly shown in FIGS. 18A-18B.
Figure 20B:
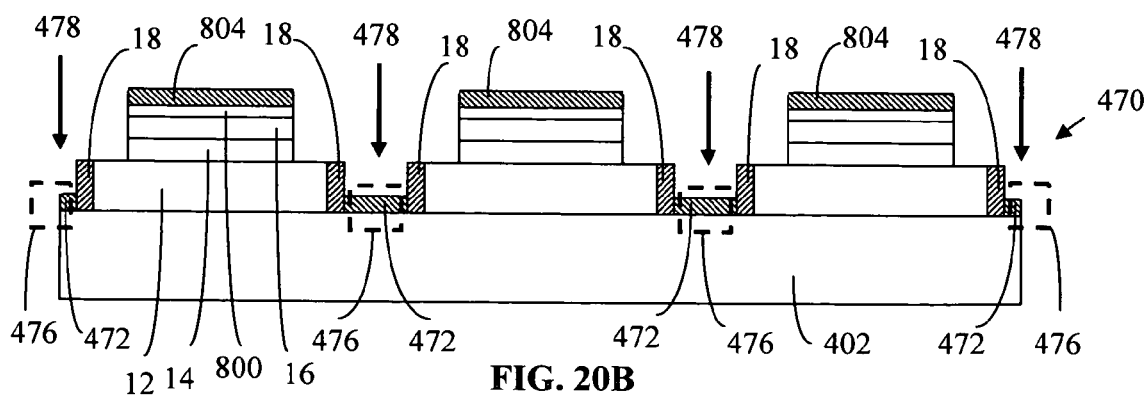
Figure 21A:
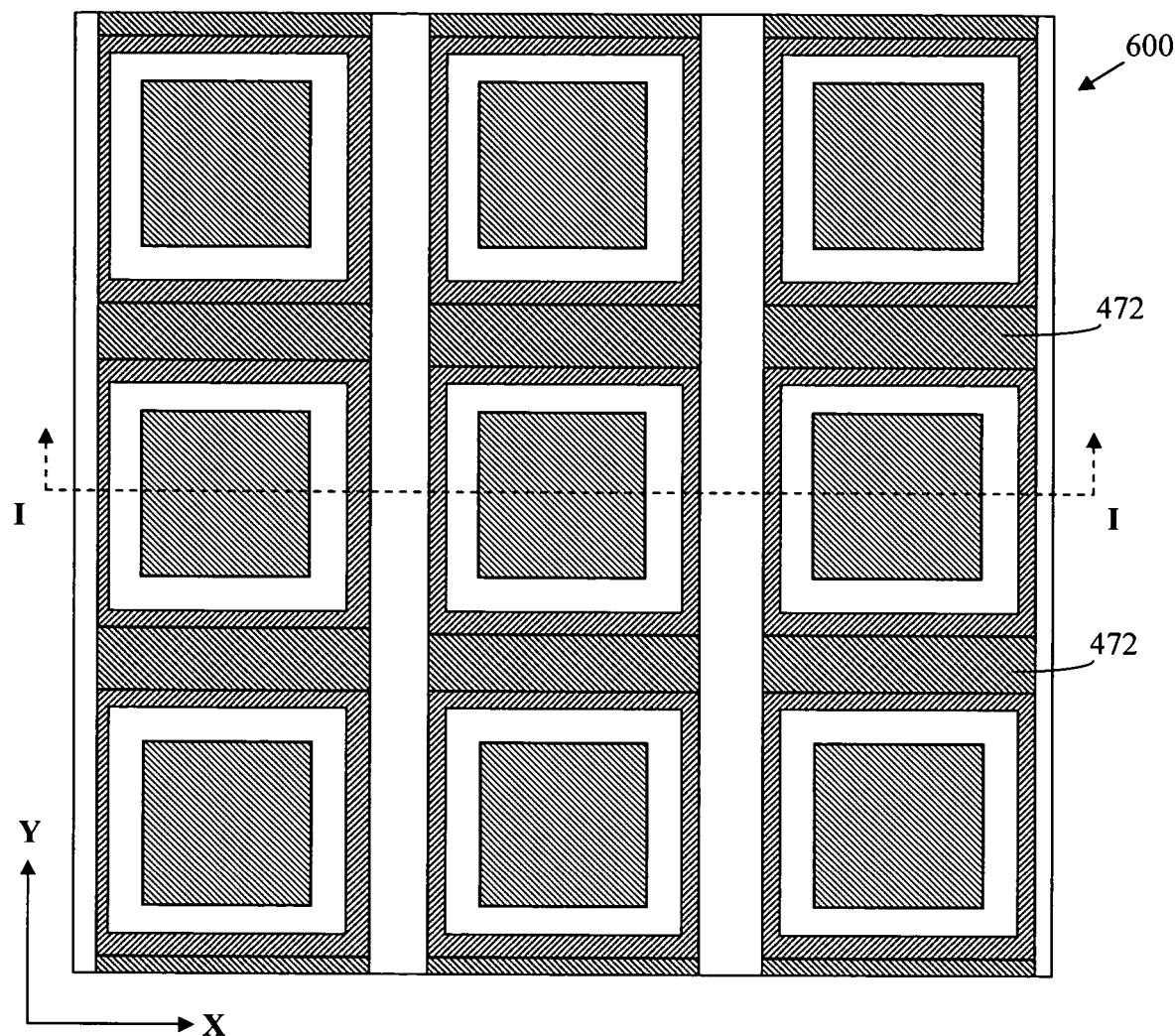
FIGS. 21A-21B illustrate an assembly having parallel strips where the metal layer has been removed by a laser etching process.
Figure 21B:
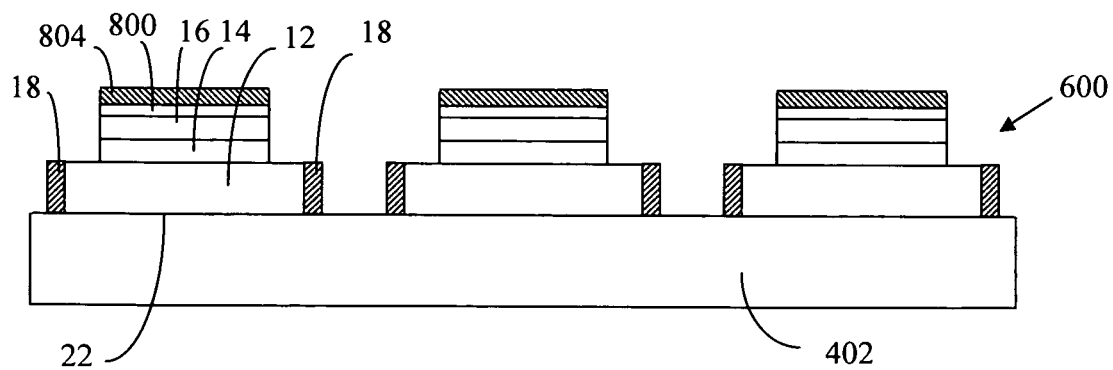

Starting with assembly 470, shown again in a top plane view in FIG. 20A and in cross-section in FIG. 20B, another embodiment of this invention is a method for fabricating at least one light emitting diode. The first step of the method for fabricating at least one light emitting diode is to remove, via an etching process, portions of the metal layer 472 located at the bottom of the first array of parallel trenches 442 of assembly 470 (the trenches 442 are illustrated on assembly 460 in FIGS. 16A and 16B). Preferably the etching process is a laser etching process. The sections of the metal layer 472 that will be removed are outlined by dashed lines 476. Laser light 478 is directed at the areas outlined by the dashed lines 476. After the metal areas inside the dashed lines are removed, the result is assembly 600 illustrated in FIGS. 21A and 21B. FIG. 21A is a top plane view of assembly 600 and FIG. 21B is a cross-sectional view along the I-I plane indicated in FIG. 21A. Assembly 600 consists of three linear arrays of LED dies where each linear array contains three LED dies. The first electrodes 18 of the three dies in each linear array are electrically connected by metal layer 472.

If desired, the linear arrays of dies may be attached to a transfer substrate and the linear arrays subsequently removed from the growth substrate by a liftoff process (not shown). The attachment of the transfer substrate and the liftoff process were described previously.

Figure 23A:
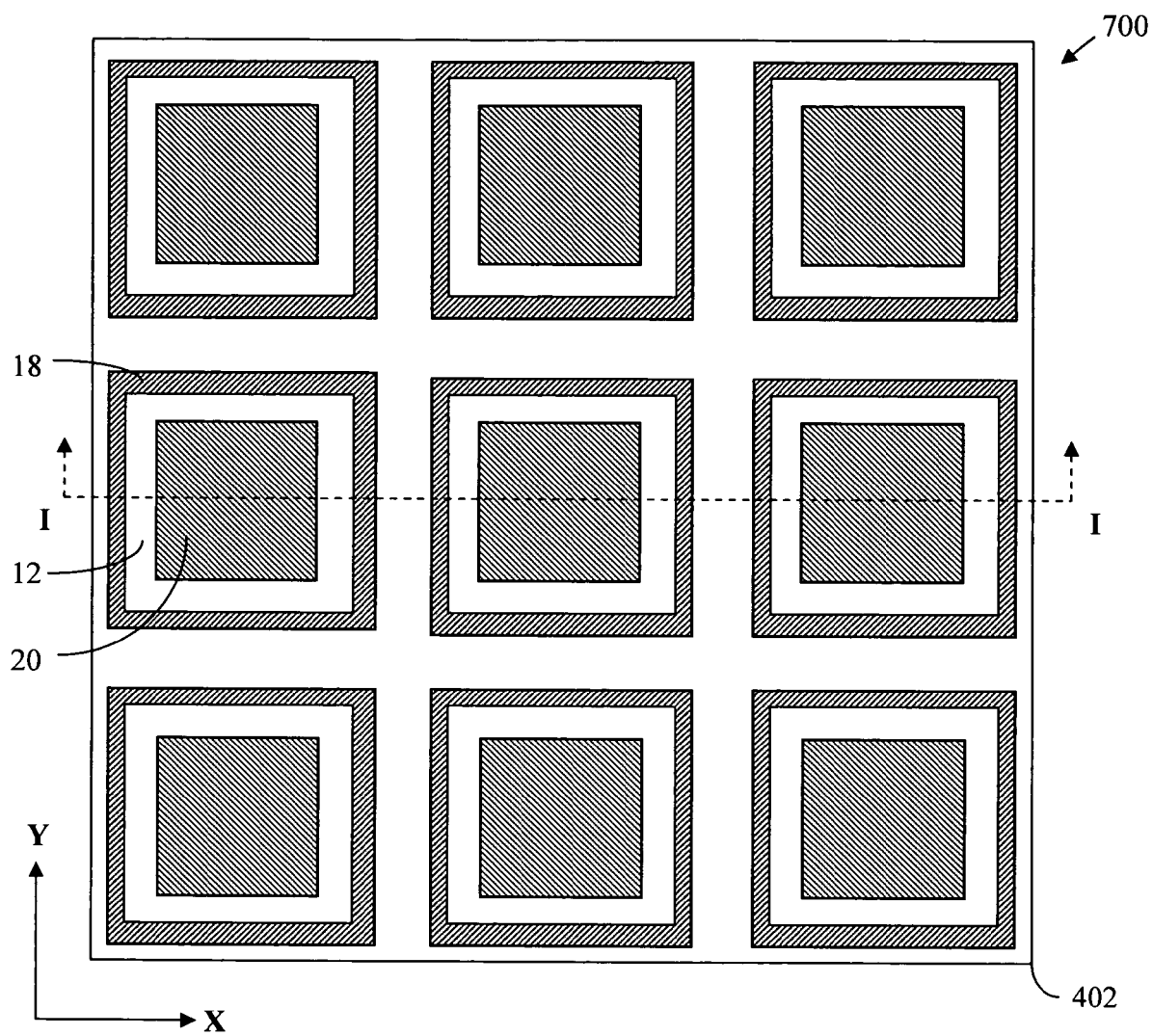
FIGS. 23A-23B illustrate an assembly having perpendicular strips where the metal layer has been removed by a laser etching process.
Figure 23B:
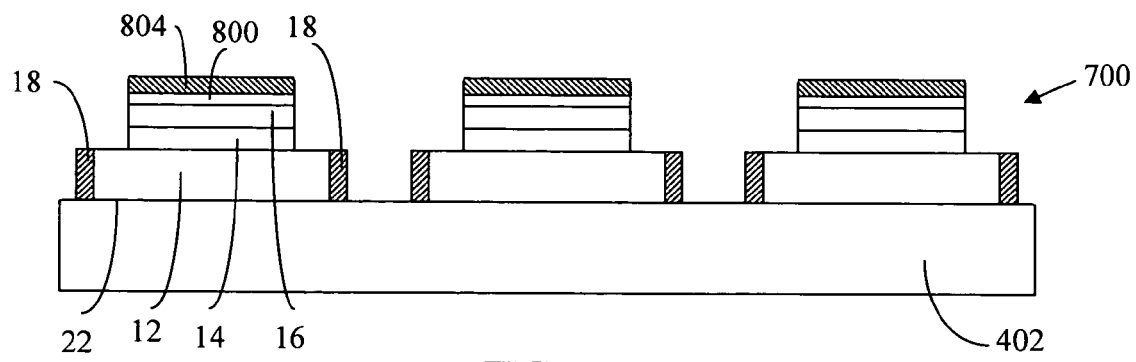

Starting with assembly 600, shown again in a top plane view in FIG. 22A and in cross-section in FIG. 22B, another embodiment of this invention is a method for fabricating at least one light emitting diode. The first step of the method for fabricating at least one light emitting diode is to remove, via an etching process, portions of the metal layer 472 located at the bottom of the second array of parallel trenches 452 of assembly 600 (the trenches 452 are illustrated on assembly 460 in FIGS. 16A and 16B). Preferably the etching process is a laser etching process. The sections of the metal layer 472 that will be removed are outlined by dashed lines 602. Laser light 604 is directed at the areas outlined by the dashed lines 602. After the metal areas inside the dashed lines are removed, the result is assembly 700 illustrated in FIGS. 23A and 23B. FIG. 23A is a top plane view of assembly 700 and FIG. 23B is a cross-sectional view along the I-I plane indicated in FIG. 23A. Assembly 700 consists of nine LED dies that are still attached to the growth substrate 402. The LED dies in assembly 700 are similar to the light emitting diode 10 of FIG. 1 except mounted on the growth substrate 402.

If desired, the nine dies may be attached to a transfer substrate and the dies subsequently removed from the growth substrate by a liftoff process (not shown). The attachment of the transfer substrate and the liftoff process were described previously. The transfer substrate may then be diced into nine pieces (not shown), forming nine single LEDs.

HVPE is a non-carbon based deposition approach as such it is inherently less absorptive. In MOCVD deposition approaches, the deposition conditions are very critical to whether or not carbon is co-deposited. Carbon being an amphoretic dopant makes it very difficult to totally exclude or detect. Carbon localizes in region of dislocations and defects. Carbon impurities are broadband absorbers unlike dislocations which are just scattering centers. Scatter is not necessarily bad due to increased light extraction from the LED, however if carbon is localized in these defects then, instead of scattering out of the device, light would be absorbed and lost. Many of the manufacturing requirements found in making an actual LED tend to lead to increases in carbon contamination. Presently, low temperatures are used for the creation of nucleation layers, which will have a tendency to have high carbon content. In general, there is also a tendency to want to operate at lower temperature to reduce thermal mismatch between various layers however this also tends to increase carbon levels. In addition, because the level of carbon impurities are very chemistry dependent and the constituent changes required to form the MQW can lead to further incorporation of carbon into the device. This is readily observed in thick depositions of GaN.

The reflectivity of the second electrode, elimination of the top electrode by a side electrode, and the introduction of a controlled amount of extraction elements leads to high overall reflectivity. Unlike AlInGaP, GaN is a high bandgap material which typically is operated significantly below the bandgap absorption of the material especially for blue and green devices. As such the amount of self absorption is more that two order of magnitude lower than AlInGaP. Free electron or carrier absorption also appears to be minimal because we have not seen a decrease in cavity efficiency as current level increase.

The use of the side contact enables the use of novel electroplating approaches such as pattern electroplating and damascence type approaches. This embedded wire grid could be Cu or Silver based and greatly increases the ability to deliver high current to the device while reducing the amount of blockage. This approach allows the creation of large area die which when coupled with the factor of 10× reduction in costs using HVPE versus MOCVD enables the fabrication of LED sources with sufficient total output lumens to enable commercial lighting applications. In order for this approach to work, sufficient thickness of the first doped semiconductor layer is required for there to be enough contact area on the side of the light emitting device. In addition, the thicker HVPE layer for the n contact enhances current spreading such that a reasonable die cell area can be attained without having significant current crowding effects.

This application also covers the combination of extraction by the side contact and a maskless approach for form the side contact in thick HVPE layers. Since the etch rates are typical 50 nm/minute for GaN, the lasing approach offers a realistic approach to cutting deep anisotropic trenches. By controlling the beam distribution, extraction surfaces can be incorporated at the same time the side contact is cut. This greatly enhances the amount of extraction within a given die cell. The isolation of each cell afforded by this approach also enables our display approaches because no light can migrate between die cells due to side contact forming a reflective boundary. This allows the fabrication of addressable isolated cell to be manufactured. The end goal being the fabrication of large area addressable displays that eliminate the need for LCOS and DLP modulators all together. The combination of this grid addressable array with an active matrix via wafer bonding or array soldering techniques is also disclosed.

While the invention has been described in conjunction with specific embodiments and examples, it is evident to those skilled in the art that many alternatives, modifications and variations will be evident in light of the foregoing descriptions. Accordingly, the invention is intended to embrace all such alternatives, modifications and variations that fall within the spirit and scope of the appended claims.

What is claimed is:

1. At least one light emitting diode, comprising:
   a first doped semiconductor layer, wherein said first doped semiconductor layer has a first surface, a second surface opposite and substantially parallel to said first surface and an edge surface that connects said first surface and said second surface, wherein said first doped semiconductor layer is a current spreading layer;
   an active region underlying and in contact with said second surface of said first semiconductor doped layer, wherein said active region emits light;
   a second doped semiconductor layer underlying and in contact with said active region;
   a first electrode, wherein said first electrode is in contact with said edge surface of said first doped semiconductor layer; and
   a second electrode underlying and in contact with said second doped semiconductor layer, wherein said second electrode includes an optically transparent layer underlying and in contact with said second doped semiconductor layer and a reflective conductive metallic layer underlying and in contact with said optically transparent layer.

2. At least one light emitting diode as in claim 1, wherein said first doped semiconductor layer is an n-doped semiconductor layer and said second doped semiconductor layer is a p-doped semiconductor layer.

3. At least one light emitting diode as in claim 2, wherein said n-doped semiconductor layer and said p-doped semiconductor layer are gallium nitride layers.

4. At least one light emitting diode as in claim 3, wherein said n-doped semiconductor layer is greater than 2 microns thick.

5. At least one light emitting diode as in claim 4, wherein said n-doped semiconductor layer is greater than 5 microns thick.

6. At least one light emitting diode as in claim 5, wherein said n-doped semiconductor layer is greater than 10 microns thick.

7. At least one light emitting diode as in claim 5, wherein said active region is a p-n homojunction, a p-n heterojunction, a p-n double heterojunction, a single quantum well, or a multiple quantum well.

8. At least one light emitting diode as in claim 5, wherein said first electrode covers substantially all of said edge surface of said first doped semiconductor layer.

9. At least one light emitting diode as in claim 4, wherein said n-doped semiconductor layer is formed by hydride vapor phase epitaxy.

10. At least one light emitting diode as in claim 1, wherein said reflective conductive metallic layer of said second electrode is silver or aluminum.

11. At least one light emitting diode as in claim 1, wherein said at least one light emitting diode is a plurality of light emitting diodes.

12. At least one light emitting diode as in claim 11, wherein said plurality of light emitting diodes is a linear array of light emitting diodes.

13. At least one light emitting diode as in claim 12, wherein said first electrodes of said light emitting diodes in said linear array of said light emitting diodes are electrically connected.

14. At least one light emitting diode as in claim 11, wherein said plurality of said light emitting diodes is a two-dimensional array of said light emitting diodes and wherein said two-dimensional array is divided into rows of said light emitting diodes and columns of said light emitting diodes and wherein said rows of said light emitting diodes are substantially perpendicular to said columns of said light emitting diodes.

15. At least one light emitting diode as in claim 14, wherein said first electrodes of said light emitting diodes in said two-dimensional array are electrically connected.

16. At least one light emitting diode as in claim 14, wherein said first electrodes of said light emitting diodes in each of said columns of said two-dimensional array are electrically connected.

17. At least one light emitting diode as in claim 16, wherein said second electrodes of said light emitting diodes in each of said rows of said two-dimensional array are electrically connected.

18. At least one light emitting diode as in claim 17, wherein when a current is applied to said first electrode of a first column of said two-dimensional array and to said second electrode of a first row of said two-dimensional array, said light emitting diode located at an intersection of said first row and said first column emits light.

19. At least one light emitting diode as in claim 1, further comprising an array of light extracting elements positioned on said first surface of said first doped semiconductor layer.

20. At least one light emitting diode as in claim 1, further comprising at least one reflector, whereby said at least one reflector is positioned adjacent to said second surface of said first doped semiconductor layer and whereby said at least one reflector is also positioned adjacent to said edge surfaces of said active region and said second doped semiconductor layer.

21. At least one light emitting diode as in claim 1, further comprising a wavelength conversion layer, whereby said wavelength conversion layer converts light of a first wavelength range emitted by said active region into light of a second wavelength range and whereby said second wavelength range is different than said first wavelength range.

22. At least one light emitting diode as in claim 1, wherein said optically transparent layer of said second electrode is electrically conductive.

23. At least one light emitting diode as in claim 22, wherein said optically transparent layer is a transparent conductive oxide.

24. At least one light emitting diode as in claim 1, wherein said optically transparent layer of said second electrode is an electrically insulating layer.

25. At least one light emitting diode as in claim 24, wherein said second electrode further comprises a plurality of electrically conductive contacts extending from said reflective conductive metallic layer through said electrically insulating layer.

26. At least one light emitting diode as in claim 25, wherein said second electrode further comprises an electrically conductive and optically transparent current spreading layer positioned between said second doped semiconductor layer and said optically transparent layer.

* * * * *